US 12,550,535 B2

(12) United States Patent
Choi et al.

(10) Patent No.: US 12,550,535 B2
(45) Date of Patent: Feb. 10, 2026

(54) DISPLAY PANEL AND METHOD FOR FABRICATING THE SAME

(71) Applicant: Samsung Display Co., LTD., Yongin-si (KR)

(72) Inventors: Dae Won Choi, Cheonan-si (KR); Sang Gab Kim, Seoul (KR); Su Bin Bae, Hwaseong-si (KR); Yun Jong Yeo, Hwaseong-si (KR); Da Woon Jung, Hwaseong-si (KR); Yu Gwang Jeong, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 633 days.

(21) Appl. No.: 17/880,744

(22) Filed: Aug. 4, 2022

(65) Prior Publication Data

US 2023/0180526 A1     Jun. 8, 2023

(30) Foreign Application Priority Data

Dec. 6, 2021   (KR) .................. 10-2021-0172631

(51) Int. Cl.
| | |
|---|---|
| *H10K 59/122* | (2023.01) |
| *H10K 50/15* | (2023.01) |
| *H10K 50/16* | (2023.01) |
| *H10K 59/124* | (2023.01) |
| *H10K 71/00* | (2023.01) |
| *H10K 59/12* | (2023.01) |
| *H10K 102/10* | (2023.01) |

(52) U.S. Cl.
CPC .......... *H10K 59/122* (2023.02); *H10K 50/15* (2023.02); *H10K 50/16* (2023.02); *H10K 71/00* (2023.02);
(Continued)

(58) Field of Classification Search
CPC .. H10K 59/122; H10K 59/124; H10K 59/173; H10K 59/80515; H10K 59/80521;
(Continued)

(56) References Cited

U.S. PATENT DOCUMENTS 8,441,178 B2 *  5/2013  Choi ................... H10K 59/122
                                                   313/500
8,487,301 B2 *  7/2013  Choi ................... H10K 59/122
                                                   313/500
(Continued)

FOREIGN PATENT DOCUMENTS

CN        109742114        1/2021
KR     1020180066556       6/2018
(Continued)

OTHER PUBLICATIONS

Extended European Search Report issued in European Patent Application No. 22211719.4, dated Apr. 4, 2023.

*Primary Examiner* — Eduardo A Rodela
(74) *Attorney, Agent, or Firm* — CANTOR COLBURN LLP

(57) ABSTRACT

A display panel includes: a plurality of first electrodes disposed on a via-layer and corresponding to a plurality of pixel areas, respectively; a pixel-defining layer disposed on the via-layer; first opening parts corresponding to central portions of the first electrodes and penetrating through the pixel-defining layer; electrode undercuts corresponding to edges of the first opening parts and provided as gaps between the first electrodes and the pixel-defining layer; a plurality of second opening parts corresponding to peripheries of the first electrodes, respectively, and penetrating through the pixel-defining layer; and via-grooves corresponding to the second opening parts and defined on an upper surface of the via-layer; via-undercuts provided by the pixel-defining layer around the second opening parts and the via-layer around the via-grooves.

13 Claims, 26 Drawing Sheets

(52) U.S. Cl.
CPC ... *H10K 59/1201* (2023.02); *H10K 2102/103* (2023.02)

(58) Field of Classification Search
CPC ........ H10K 50/15; H10K 50/16; H10K 71/00; H10K 59/1201; H10K 2102/103; H10K 59/121; H10K 59/131; H10K 50/844; H10K 59/30
See application file for complete search history.

(56) References Cited

U.S. PATENT DOCUMENTS

| | | | |
|---|---|---|---|
| 10,811,478 B2 | 10/2020 | Choi et al. | |
| 11,444,140 B2 | 9/2022 | Seo et al. | |
| 11,494,017 B2* | 11/2022 | Ye | H10K 59/353 |
| 11,495,653 B2* | 11/2022 | Kwack | H10K 59/131 |
| 11,502,273 B2* | 11/2022 | Lee | H10K 59/87 |
| 11,785,799 B2* | 10/2023 | Kang | H10K 59/8731 257/40 |
| 12,075,645 B2* | 8/2024 | Sung | H10K 77/00 |
| 2016/0043341 A1* | 2/2016 | Heo | H10K 59/1315 438/23 |
| 2019/0326372 A1 | 10/2019 | Han | |
| 2020/0044001 A1 | 2/2020 | Lim et al. | |
| 2023/0077299 A1* | 3/2023 | Lee | H10K 50/824 |
| 2023/0132679 A1* | 5/2023 | Wright | B01D 46/42 55/385.1 |

FOREIGN PATENT DOCUMENTS

| | | |
|---|---|---|
| KR | 1020200044520 | 4/2020 |
| KR | 1020210028789 A | 3/2021 |
| KR | 1020210083917 | 7/2021 |

* cited by examiner

DISPLAY PANEL AND METHOD FOR FABRICATING THE SAME

This application claims priority to Korean Patent Application No. 10-2021-0172631, filed on Dec. 6, 2021, and all the benefits accruing therefrom under 35 U.S.C. § 119, the content of which in its entirety is herein incorporated by reference.

BACKGROUND

1. Technical Field

The present disclosure relates to a display panel and a method for fabricating the same.

2. Description of the Related Art

As the information society develops, the demand for a display device for displaying images has increased and diversified. For example, the display device has been applied to various electronic devices such as smartphones, digital cameras, laptop computers, navigation devices, and smart televisions.

The display device may be implemented as an organic light emitting display device, a liquid crystal display device, a plasma display device, a field emission display device, an electrophoretic display device, an electro-wetting display device, a quantum dot light emitting display device, a micro light emitting diode ("LED") display device, or the like.

Among them, the organic light emitting display device includes a plurality of emitting devices corresponding to a plurality of pixel areas, and each of the plurality of emitting devices emits light having luminance corresponding to a driving current supplied thereto. As such, the organic light emitting display device implements image display using self-emitting devices, and thus has comparatively excellent performance in terms of power consumption, response speed, luminous efficiency, luminance, and wide viewing angle, or the like, as compared with other display devices.

SUMMARY

The display device tends to increase a density of the plurality of pixel areas in order to improve resolution. Therefore, the plurality of emitting devices corresponding to the plurality of pixel areas are disposed very adjacent to each other, such that the plurality of pixel areas may not be independently driven, and thus, display quality may be deteriorated.

Aspects of the present disclosure provide a display panel in which a plurality of pixel areas may be independently driven regardless of a density of the plurality of pixel areas to prevent deterioration of display quality, and a method for fabricating the same.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a display panel includes: a substrate including a plurality of pixel areas; a via-layer disposed on the substrate; a plurality of first electrodes disposed on the via-layer and corresponding to the plurality of pixel areas, respectively; a pixel-defining layer disposed on the via-layer and made of an inorganic insulating material; first opening parts corresponding to central portions of the first electrodes and penetrating through the pixel-defining layer; electrode undercuts corresponding to edges of the first opening parts and provided as gaps between the first electrodes and the pixel-defining layer; a plurality of second opening parts corresponding to peripheries of the first electrodes, respectively, spaced apart from each other, and penetrating through the pixel-defining layer; via-grooves corresponding to the second opening parts and defined on an upper surface of the via-layer; via-undercuts provided by the pixel-defining layer around the second opening parts and the via-layer around the via-grooves; an emitting structure disposed on the first electrodes and the pixel-defining layer; and a second electrode corresponding to the plurality of pixel areas and disposed on the emitting structure.

The second opening parts may be disposed in non-emitting areas between pixel areas corresponding to different colors and neighboring to each other among the plurality of pixel areas, and may be formed in parallel with each other at edges of the first electrodes.

Each of the via-groove may have a greater width than each of the second opening parts. Each of the via-undercuts may be provided by a structure in which a lower surface of the pixel-defining layer around a corresponding second opening part protrudes from the upper surface of the via-layer around a corresponding via-groove.

The emitting structure disposed on the first electrodes may include an emitting layer, a hole transport layer disposed between the emitting layer and the first electrode, and an electron transport layer disposed between the emitting layer and the second electrode. The emitting structure disposed on the pixel defining layer may include the hole transport layer disposed on the first electrodes, and the electron transport layer disposed between the emitting layer and the second electrode. The emitting layer may correspond to each of the plurality of pixel areas. The hole transport layer and the electron transport layer may correspond to the plurality of pixel areas. The hole transport layer and the electron transport layer of the emitting structure and the second electrode each may be partially separated by a corresponding via-undercut.

The hole transport layer, the electron transport layer, and the second electrode may be further disposed in the via-groove. The hole transport layer of the via-groove may be separated from the hole transport layer on the pixel-defining layer by the via-undercut.

The via-undercut may have a width of about 0.35 micrometers (μm) or more.

A ratio of a width of the via-undercut to a height of the via-undercut may be in a range of about 50 percentages (%) to about 100%.

Two or more second opening parts may be disposed in parallel with each other in the non-emitting areas between two pixel areas corresponding to the different colors and neighboring to each other among the plurality of pixel areas. A gap of any two of the two or more second opening parts may be about 1 μm or more.

The display panel may further include a circuit layer disposed on the substrate, including a plurality of thin film transistors corresponding to the plurality of pixel areas, and covered with the via-layer, and groove protection layers disposed between the circuit layer and the via-layer. The groove protection layers may be disposed in the non-emitting areas between the pixel areas corresponding to the different colors and neighboring to each other among the plurality of pixel areas. At least portions of the groove protection layers may be exposed to the via-grooves.

The display panel may further include an auxiliary via-layer disposed between the circuit layer and the via-layer. The groove protection layers may be disposed on the auxiliary via-layer.

Each of the central portions of the first electrodes corresponding to each of the first opening parts may refer to a remaining portion of a corresponding first electrode excluding an edge of the first electrode. The edge of the first electrode may be covered with the pixel-defining layer. In the electrode undercut, the first electrode and the pixel-defining layer may be spaced apart from each other while directly facing each other, and the emitting structure on the first electrode may be separated from the emitting structure on the pixel-defining layer by the electrode undercut.

The display panel may further include an electrode protection layer corresponding to an edge of the electrode undercut, disposed on the edge of the first electrode, and covered with the pixel-defining layer. The electrode undercut may be provided by a structure in which the lower surface of the pixel-defining layer corresponding to the edge of the first opening part protrudes from the electrode protection layer.

The electrode protection layer is made of any one of IZO and IGZO.

According to an embodiment, a method for fabricating a display panel, includes: disposing a via-layer on a substrate including a plurality of pixel areas, disposing a plurality of first electrodes corresponding to the plurality of pixel areas, respectively, on the via-layer; disposing a plurality of electrode protection layers on the plurality of first electrodes, respectively; disposing a pixel-defining layer covering the plurality of first electrodes and the plurality of electrode protection layers by applying an inorganic insulating material onto the via-layer; defining a plurality of first opening parts and a plurality of second opening parts by patterning the pixel-defining layer, where the plurality of first opening parts correspond to central portions of the plurality of first electrodes, respectively, and the plurality of second opening parts correspond to peripheries of the plurality of first electrodes, respectively, and are spaced apart from each other; defining a plurality of via-grooves corresponding to the plurality of second opening parts, respectively, and defined on an upper surface of the via-layer by patterning the via-layer; disposing an emitting structure on the plurality of first electrodes and the pixel-defining layer; and disposing a second electrode corresponding to the plurality of pixel areas on the emitting structure.

In the disposing of the plurality of first opening parts and the plurality of second opening parts, the second opening parts may be disposed in non-emitting areas between pixel areas corresponding to different colors and neighboring to each other among the plurality of pixel areas, and are formed in parallel with each other at edges of the first electrodes.

In the disposing of the plurality of via-grooves, each of the via-grooves may have a greater width than each of the second opening parts, and a via-undercut may be provided by a structure in which a lower surface of the pixel-defining layer around a corresponding second opening part protrudes from the upper surface of the via-layer around a corresponding via-groove.

In the disposing of the emitting structure, the emitting structure disposed on the first electrodes may include an emitting layer, a hole transport layer disposed between the emitting layer and the first electrode, and an electron transport layer disposed between the emitting layer and the second electrode. The emitting structure disposed on the pixel defining layer may include the hole transport layer disposed on the first electrodes, and the electron transport layer disposed between the emitting layer and the second electrode. The emitting layer may correspond to each of the plurality of pixel areas. The hole transport layer and the electron transport layer may correspond to the plurality of pixel areas, and each may be partially separated by a corresponding via-undercut.

In the disposing of the second electrode, the second electrode may be partially separated by the via-undercut.

In the disposing of the emitting structure, the hole transport layer of the via-groove may be separated from the hole transport layer on the pixel-defining layer by the via-undercut.

In the disposing of the plurality of first opening parts and the plurality of second opening parts, two or more second opening parts may be disposed in parallel with each other in the non-emitting areas between two pixel areas corresponding to the different colors and neighboring to each other among the plurality of pixel areas.

The method for fabricating a display panel, may further include: before the disposing of the via-layer, disposing a circuit layer on the substrate, the circuit layer including a plurality of thin film transistors corresponding to the plurality of pixel areas; and disposing groove protection layers on the circuit layer. In the disposing of the groove protection layers, the groove protection layers are disposed in the non-emitting areas between the pixel areas corresponding to the different colors and neighboring to each other among the plurality of pixel areas. In the disposing of the via-layer, the groove protection layers are covered with the via-layer. In the disposing of the plurality of via-grooves, at least portions of the groove protection layers are exposed to the via-grooves.

The method for fabricating a display panel, may further include, before the disposing of the groove protection layers, disposing an auxiliary via-layer covering the circuit layer. In the disposing of the groove protection layers, the groove protection layers may be disposed on the auxiliary via-layer.

The disposing of the plurality of first opening parts and the plurality of second opening parts includes: preparing the plurality of first opening parts and the plurality of second opening parts by patterning the pixel-defining layer in a state in which a predetermined patterning mask is disposed on the pixel-defining layer, and preparing electrode undercuts corresponding to edges of the first opening parts and formed as gaps between the first electrodes and the pixel-defining layer by patterning the electrode protection layers. In the preparing of the electrode undercuts, each of the edges of the first electrodes may be covered with the pixel-defining layer, and in each of the electrode undercut, a corresponding first electrode and the pixel-defining layer may directly face each other while being spaced apart from each other.

In the disposing of the emitting structure, the emitting structure on the first electrode may be separated from the emitting structure on the pixel-defining layer by the electrode undercut.

In the disposing of the plurality of electrode protection layers, the electrode protection layer may be made of any one of IZO and IGZO.

In the preparing of the electrode undercuts, a portion of the electrode protection layer corresponding to an edge of a corresponding electrode undercut may remain on an edge of the first electrode.

A display panel according to embodiments includes first opening parts corresponding to central portions of first electrodes of each pixel area and penetrating through a pixel-defining layer, electrode undercuts provided as gaps between the first electrodes and the pixel-defining layer around the first opening parts, a plurality of second opening parts corresponding to a periphery of each of the first electrodes, spaced apart from each other, and penetrating through the pixel-defining layer, via-grooves corresponding to the second opening parts and defined on an upper surface of the via-layer disposed below the pixel-defining layer, and via-undercuts provided by the via-layer around the via-grooves and the pixel-defining layer around the second opening parts.

An emitting structure on the first electrode may be separated from an emitting structure on the pixel-defining layer by such an electrode undercut to be provided in an independent island-shaped pattern.

In addition, the emitting structure disposed in a non-emitting area between neighboring pixel areas may be partially separated by the via-undercut, and thus, a current path generated through the emitting structure between the neighboring pixel areas may be lengthened.

As described above, the emitting structure may be separated by the electrode undercut and the via-undercut, and thus, a leakage current through a common layer of the emitting structure may be prevented. Accordingly, emission of light by a driving current of a neighboring pixel area may be prevented, and thus, a display quality of the display panel may be effectively improved.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
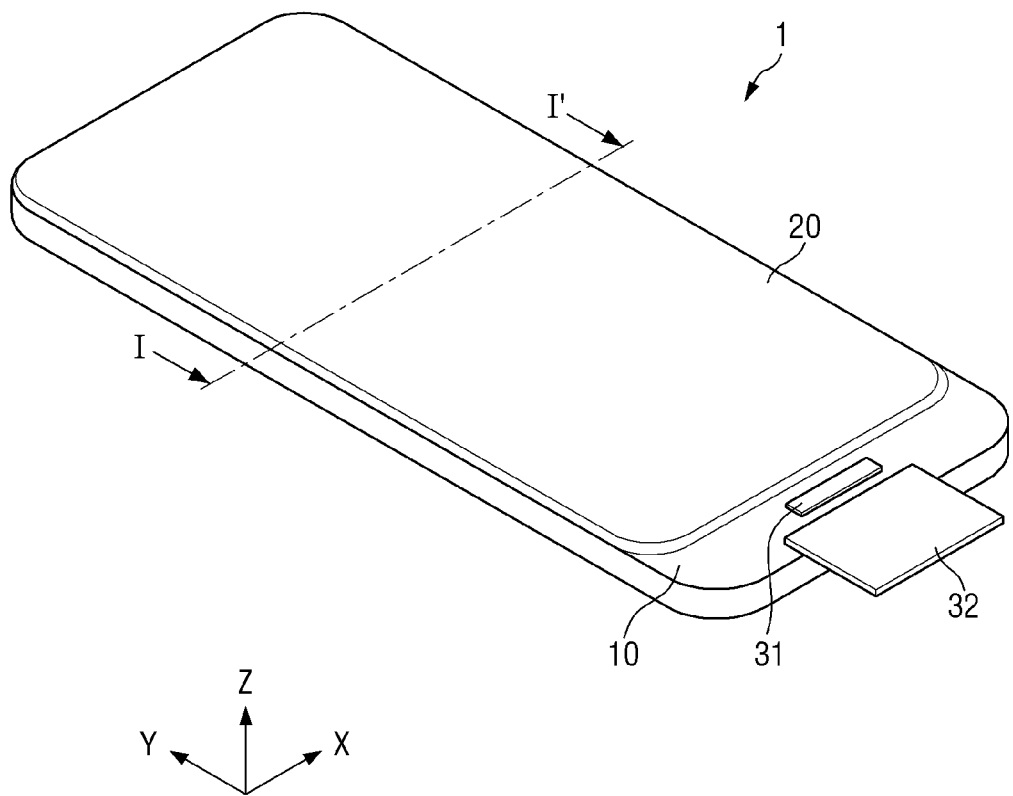
FIG. 1 is a perspective view illustrating a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above (view in a third direction (Z-axis direction)), and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
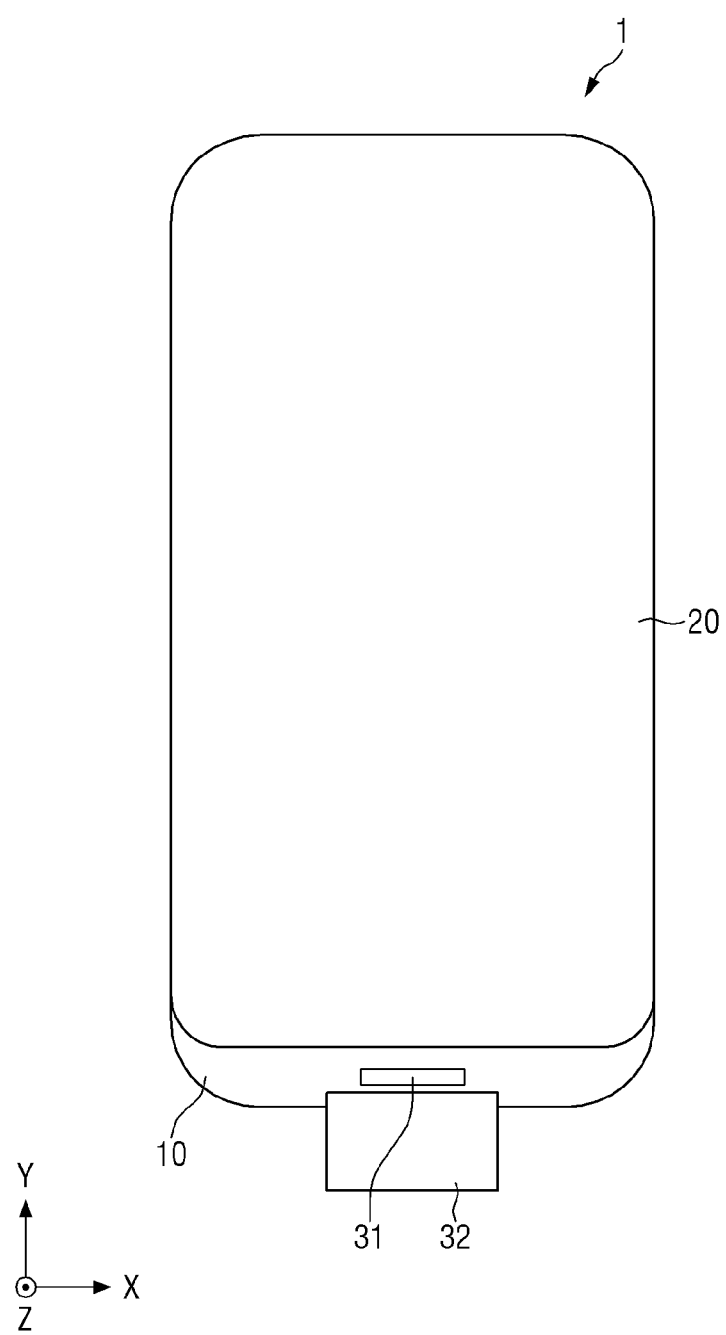
FIG. 2 is a plan view illustrating the display device of FIG. 1.

FIG. 1 is a perspective view illustrating a display device according to an embodiment. FIG. 2 is a plan view illustrating the display device of FIG. 1.

Referring to FIGS. 1 and 2, a display device 1 according to an embodiment may include a display panel 10 emitting light for image display and a protection substrate 20 disposed on the display panel 10.

In addition, the display device 1 may further include a display driving circuit 31 driving the display panel 10 and a display circuit board 32.

In addition, the display device 1 may further include a touch sensing unit (not illustrated) for detecting coordinates of a point touched by a user on a display surface. The touch sensing unit may be disposed on one surface of the protection substrate 20 facing the display panel 10. Alternatively, the touch sensing unit may be embedded in the display panel 10.

The touch sensing unit may include touch electrodes (not illustrated) arranged in a touch sensing area corresponding to the display surface and made of a transparent conductive material.

Such a touch sensing unit may detect whether or not a touch input exists and coordinates of a point where a touch is input by periodically sensing changes in capacitance values of the touch electrodes in a state in which touch driving signals are applied to the touch electrodes.

The display surface of the display panel 10 from which light for image display is emitted, that is, an upper surface of the display panel 10 may have a rectangular shape having short sides in a first direction (X-axis direction) and long sides in a second direction (Y-axis direction) crossing the first direction (X-axis direction). However, this is only an example, and a shape of the display surface of the display panel 10 may be variously modified.

As an example, the display surface of the display panel 10 may have a shape in which a corner where the short side in the first direction (X-axis direction) and the long side in the second direction (Y-axis direction) meet is rounded with a predetermined curvature. Alternatively, the display surface of the display panel 10 may have shapes such as a polygonal shape, a circular shape, or an elliptical shape.

It has been illustrated in FIG. 1 that the display panel 10 has a flat panel shape, but an embodiment is not limited to that illustrated in FIG. 1. As another example, the display panel 10 may have a shape in which opposite ends thereof in the Y-axis direction are bent. Alternatively, the display panel 10 may be flexibly provided to be bent, folded, or rolled.

The protection substrate 20 may be attached onto the display panel 10.

The protection substrate 20 is to protect the display panel 10 from external physical impact against the display surface, and may be made of a transparent material having an insulation property and rigidity.

The display driving circuit 31 outputs signals and voltages for driving the display panel 10. For example, the display driving circuit 31 may supply data signals to data lines DL (see FIG. 3) of the display panel 10 and supply driving power to power lines PL (see FIG. 3) of the display panel 10. In addition, the display driving circuit 31 may supply scan control signals to a scan driver 33 (see FIG. 3) embedded in the display panel 10.

The display driving circuit 31 may be provided as an integrated circuit ("IC"), and an integrated circuit chip of the display driving circuit 31 may be directly mounted on the display panel 10 in a chip on glass ("COG") manner, a chip on plastic ("COP") manner, or an ultrasonic bonding manner. In this case, the integrated circuit chip of the display driving circuit 31 may be disposed in an area of the display panel 10 that is not covered by the protection substrate 20.

Alternatively, unlike illustrated in FIGS. 1 and 2, the integrated circuit chip of the display driving circuit 31 may be mounted on the display circuit board 32.

The display circuit board 32 may include an anisotropic conductive film. The display circuit board 32 may be a flexible printed circuit board, a printed circuit board, or a flexible film such as a chip on film.

The display circuit board 32 may be attached to electrode pads of the display panel 10. Therefore, lead lines of the display circuit board 32 may be electrically connected to the electrode pads of the display panel 10.

Figure 3:
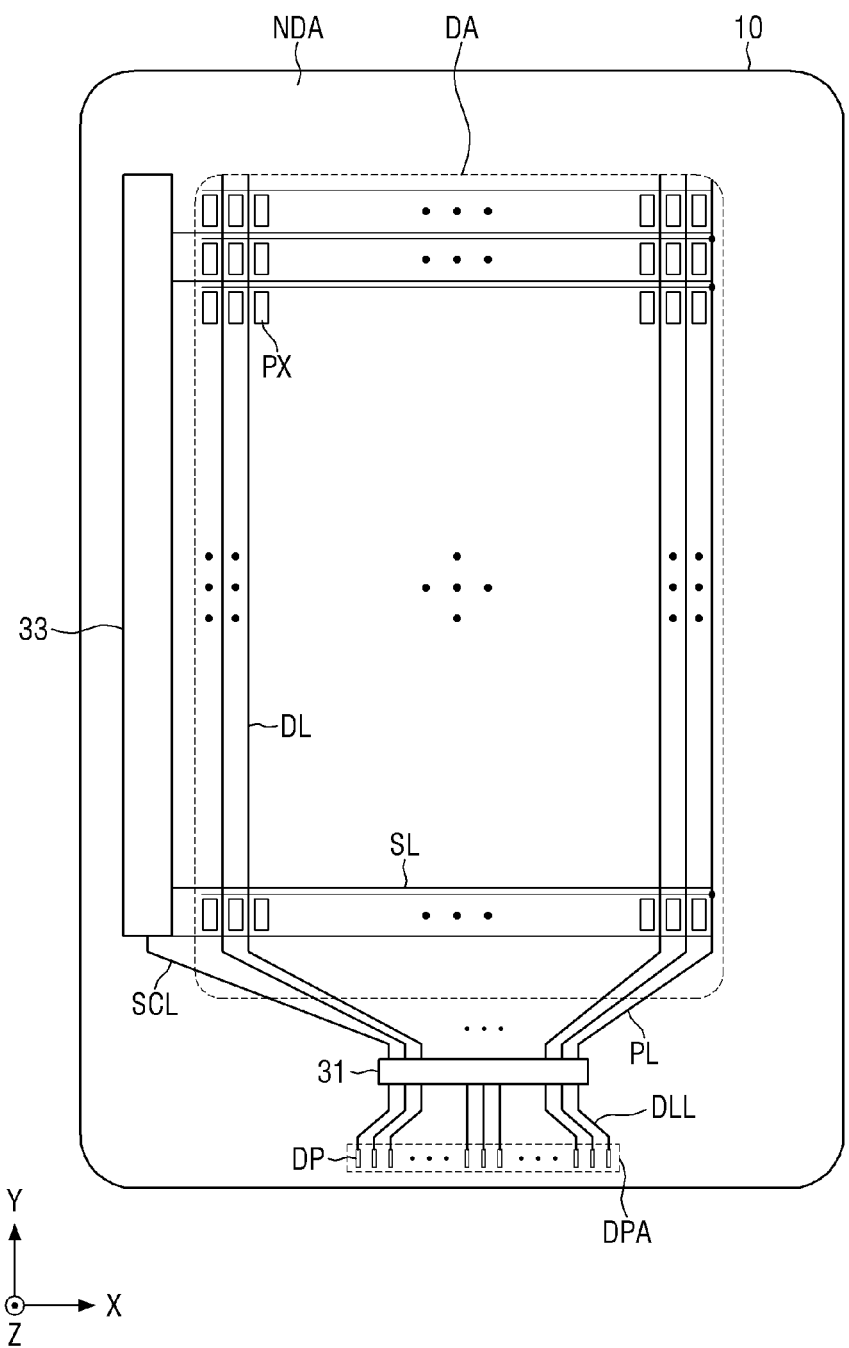
FIG. 3 is a plan view illustrating an example of a display panel of FIG. 1.
Figure 4:
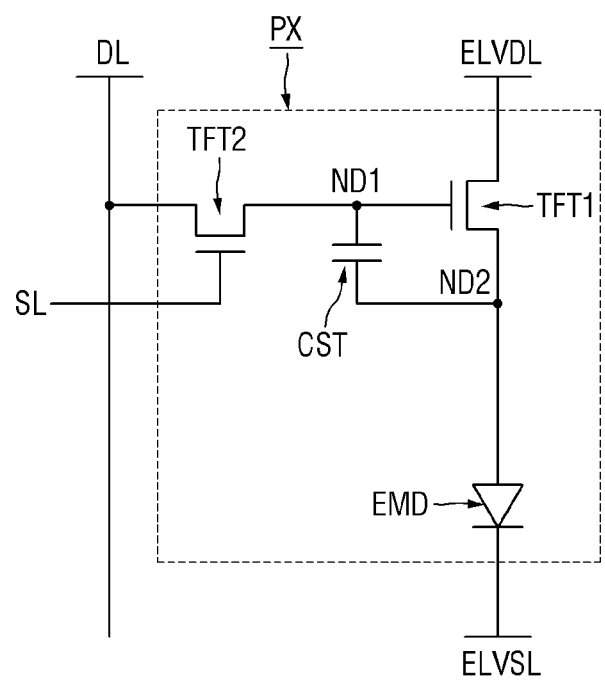
FIG. 4 is an equivalent circuit diagram illustrating an example of a pixel area of FIG. 3.
Figure 5:
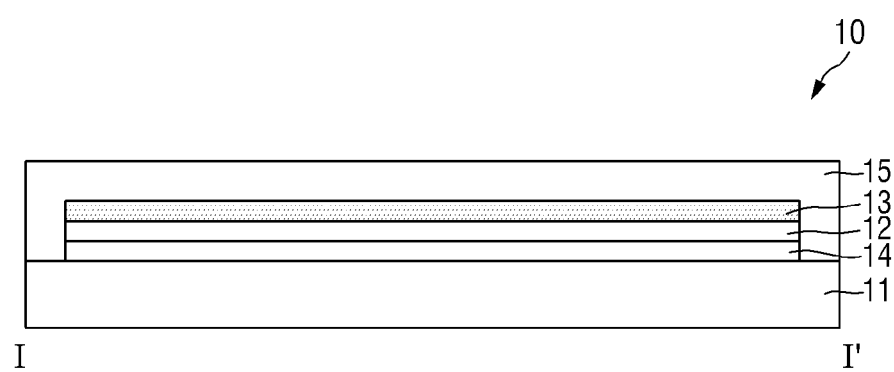
FIG. 5 is a cross-sectional view illustrating an example taken along I-I' of FIG. 1.

FIG. 3 is a plan view illustrating an example of a display panel of FIG. 1. FIG. 4 is an equivalent circuit diagram illustrating an example of a pixel area of FIG. 3. FIG. 5 is a cross-sectional view illustrating an example taken along I-I' of FIG. 1.

Referring to FIG. 3, the display panel 10 may include a display area DA emitting light for image display, and a non-display area NDA that is a peripheral area of the display area DA. The non-display area NDA may be defined as an area from an edge of the display area DA to an edge of the display panel 10.

The display panel 10 includes a plurality of pixel areas PX arranged in a matrix form in the display area DA. The plurality of pixel areas PX may be unit areas displaying respective luminance.

The display panel 10 may further include display electrode pads DP disposed in a display electrode pad area DPA adjacent to the edge of the display panel 10 in the non-display area NDA.

The display circuit board 32 (see FIGS. 1 and 2) may be attached to the display electrode pad area DPA and be connected to the display electrode pads DP.

The display panel 10 may further include wirings disposed in the display area DA and supplying signals or driving power to the plurality of pixel areas PX. The wirings of the display panel 10 may include scan lines SL, data lines DL, and power lines PL.

The scan lines SL may be disposed in a left and right direction (X direction).

The data lines DL may be disposed in an up and down direction (Y direction).

The power lines PL may be disposed in at least one of the left and right direction (X direction) and the up and down direction (Y direction). For example, the power lines PL may be disposed in a mesh shape.

The scan lines SL supplies scan signals for selecting pixel areas arranged in any one left and right direction (X direction) as pixel area to which data signals are to be written to the pixel areas.

The scan lines SL may be connected to a scan driver 33 disposed in a portion of the non-display area NDA of the display panel 10.

The scan driver 33 may receive a scan control signal from the display driving circuit 31 through at least one scan control line SCL.

The scan driver 33 may sequentially supply scan signals to a plurality of scan lines SL arranged in the display area DA during each frame period for image display, based on the scan control signal.

Referring to FIG. 3, the scan driver 33 is disposed in a portion of the non-display area NDA adjacent to the left side of the display area DA. However, this is only an example, and the scan driver 33 may be also disposed in another portion of the non-display area NDA adjacent to the right side of the display area DA. That is, the scan driver 33 may be disposed on opposite sides of the display area DA in the left and right direction.

The data lines DL are connected to pixel areas arranged in any one up and down directions (Y direction), and supplies data signals corresponding to the luminance of each pixel area.

The data lines DL may be connected to the display driving circuit 31, and the display driving circuit 31 may supply data signals of each of the pixel areas to which the scan signals are supplied, to the data lines DL.

The display driving circuit 31 may be connected to the display electrode pads DP through data link lines DLL, and may receive digital video data and timing signals from the display circuit board 32 connected to the display electrode pads DP.

The power lines PL supply first driving power for driving emitting devices EMD (see FIG. 4).

The power lines PL may receive the first driving power from the display driving circuit 31 or the display circuit board 32.

Each of the plurality of pixel areas PX includes a pixel driving circuit supplying a driving current to the emitting device EMD based on signals and power supplied through the scan line SL, the data line DL, the power line PL, and the like.

FIG. 4 illustrates a case where the pixel driving circuit of each pixel area PX has a 2T1C structure including two transistors and one capacitor. However, the pixel driving circuit illustrated in FIG. 4 is only an example, and each pixel area PX according to an embodiment may include a pixel driving circuit having a different structure from that illustrated in FIG. 4.

Referring to FIG. 4, each pixel area PX may include an emitting device EMD, first and second thin film transistors TFT1 and TFT2, and a storage capacitor CST.

The emitting device EMD may be an organic light emitting diode ("OLED") including an emitting structure made of an organic material.

The first thin film transistor TFT1 is connected to the emitting device EMD in series between first driving power ELVDL through the power line PL (see FIG. 3) and second driving power ELVSL having a voltage level lower than that of the first driving power ELVDL.

That is, a first electrode of the first thin film transistor TFT1 may be connected to the power line PL supplying the first driving power ELVDL, and a second electrode of the first thin film transistor TFT1 may be connected to a first electrode (e.g., an anode electrode) of the emitting device EMD. In addition, a second electrode (e.g., a cathode electrode) of the emitting device EMD may be connected to the second driving power source ELVSL.

The first thin film transistor TFT1 generates a driving current having a magnitude corresponding to a voltage difference between a gate electrode and the first electrode thereof between the first driving power source ELVDL and the second driving power source ELVSL.

The emitting device EMD emits light having luminance corresponding to the driving current of the first thin film transistor TFT1.

The storage capacitor CST is disposed between a first node ND1 and a second node ND2. The first node ND1 is a contact connected to the gate electrode of the first thin film transistor TFT1. The second node ND2 is a contact between the first thin film transistor TFT1 and the emitting device EMD. The storage capacitor CST stores a voltage difference between the gate electrode and the second electrode of the first thin film transistor TFT1.

The second thin film transistor TFT2 is connected between the data line DL and the first node ND1, and is turned on based on a scan signal of the scan line SL. When the second thin film transistor TFT2 is turned on by the scan signal, a data signal of the data line DL is supplied to the gate electrode of the first thin film transistor TFT1 and the storage capacitor CST through the first node ND1.

Referring to FIG. 4, the first and second thin film transistors TFT1 and TFT2 are formed as N-type metal oxide semiconductor field effect transistors ("MOSFETs"), but this is only an example. That is, at least one of the first and second thin film transistors TFT1 and TFT2 may be a P-type MOSFET.

Referring to FIG. 5, the display panel 10 according to an embodiment may include a substrate 11 including the plurality of pixel areas PX (see FIG. 3), a via-layer 12 disposed on the substrate 11, and an emitting device layer 13 disposed on the via-layer 12 and including a plurality of emitting devices EMD (see FIG. 4) corresponding to the plurality of pixel areas PX.

In addition, the display panel 10 may further include a circuit layer 14 disposed on the substrate 11, covered with the via-layer 12, and including a plurality of thin film transistors TFT1 and TFT2 (see FIG. 4): TFT (see FIG. 8) corresponding to the plurality of pixel areas PX.

In addition, the display panel 10 may further include an encapsulation structure 15 covering the emitting device layer 13.

Figure 6:
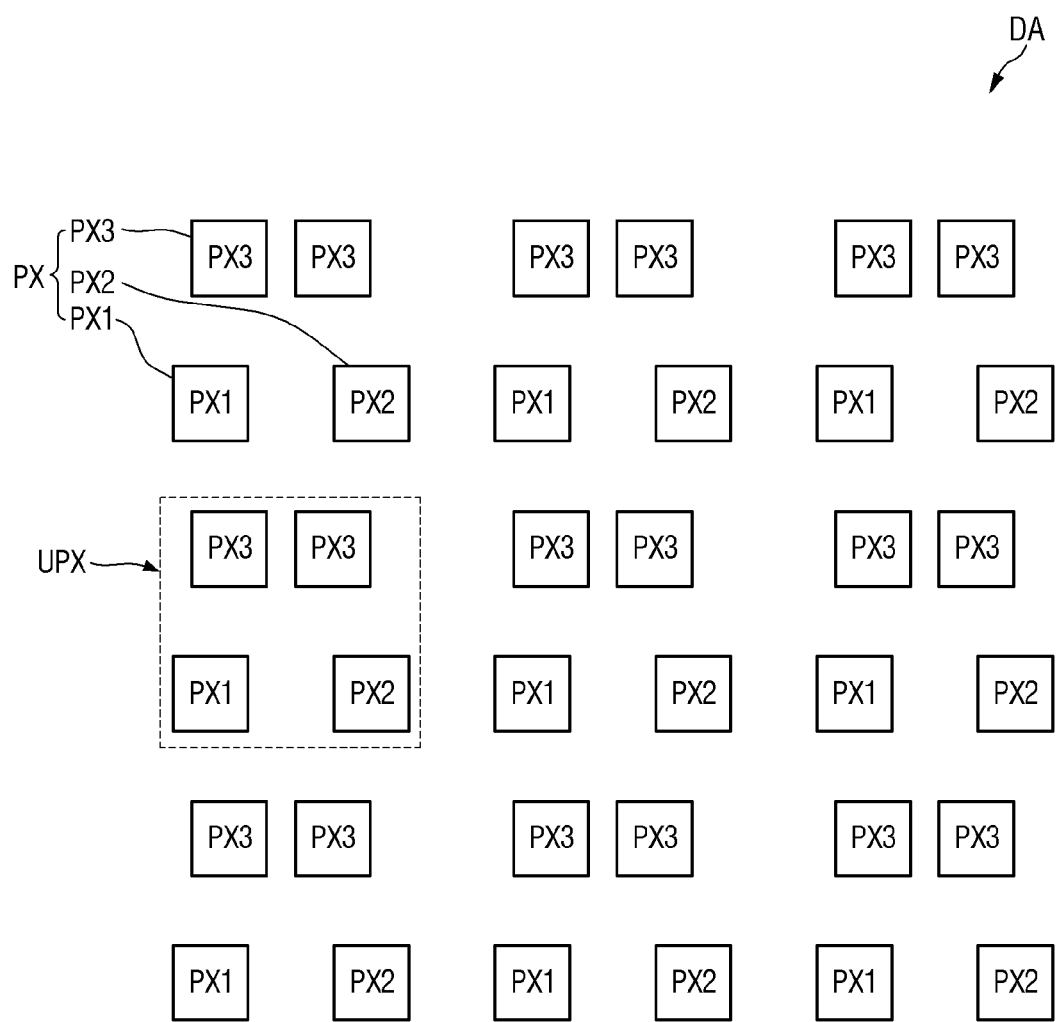
FIG. 6 is a plan view illustrating an example of a plurality of pixel areas arranged in a display area of FIG. 3.
Figure 7:
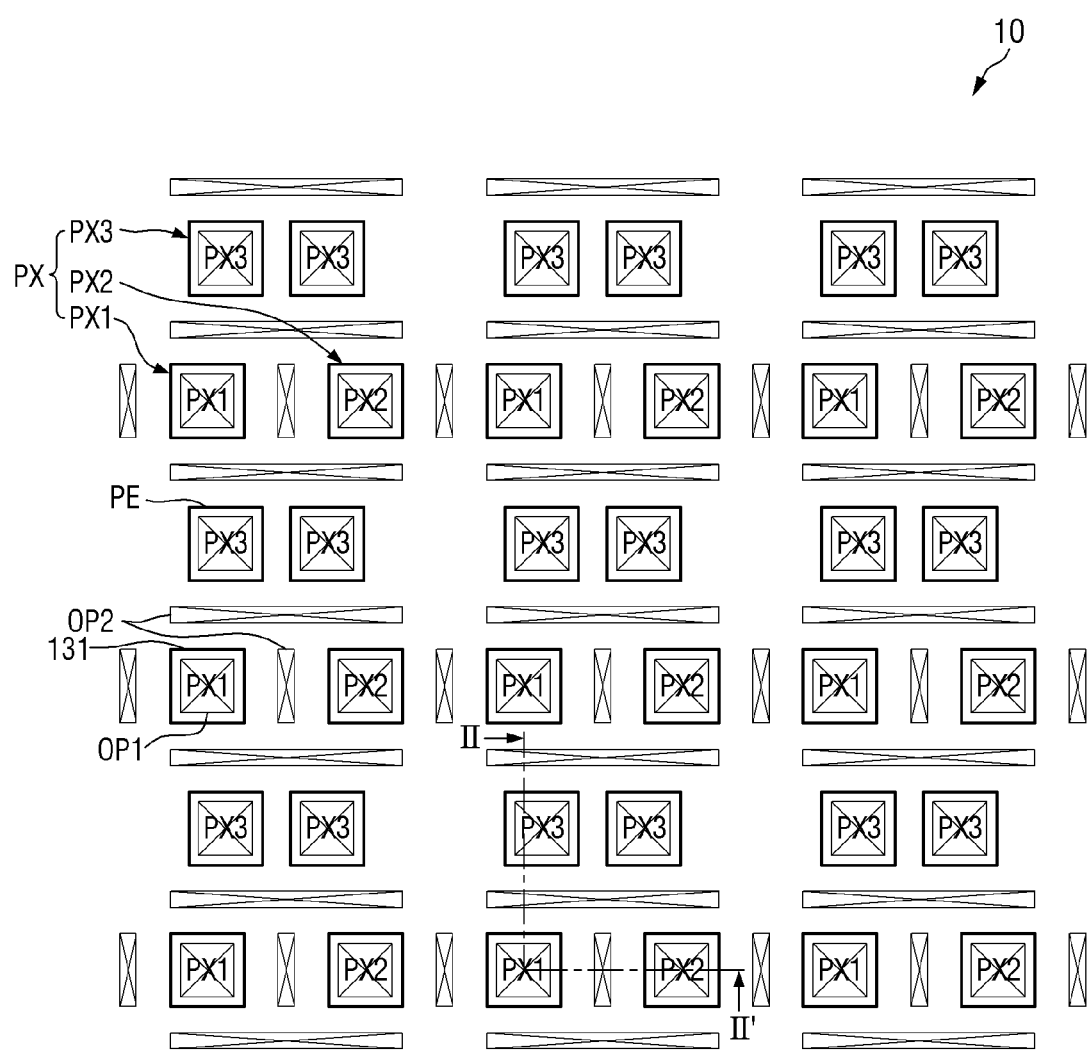
FIG. 7 is a plan view illustrating an example of an arrangement of first electrodes and first and second opening parts in a display panel of FIG. 6.
Figure 8:
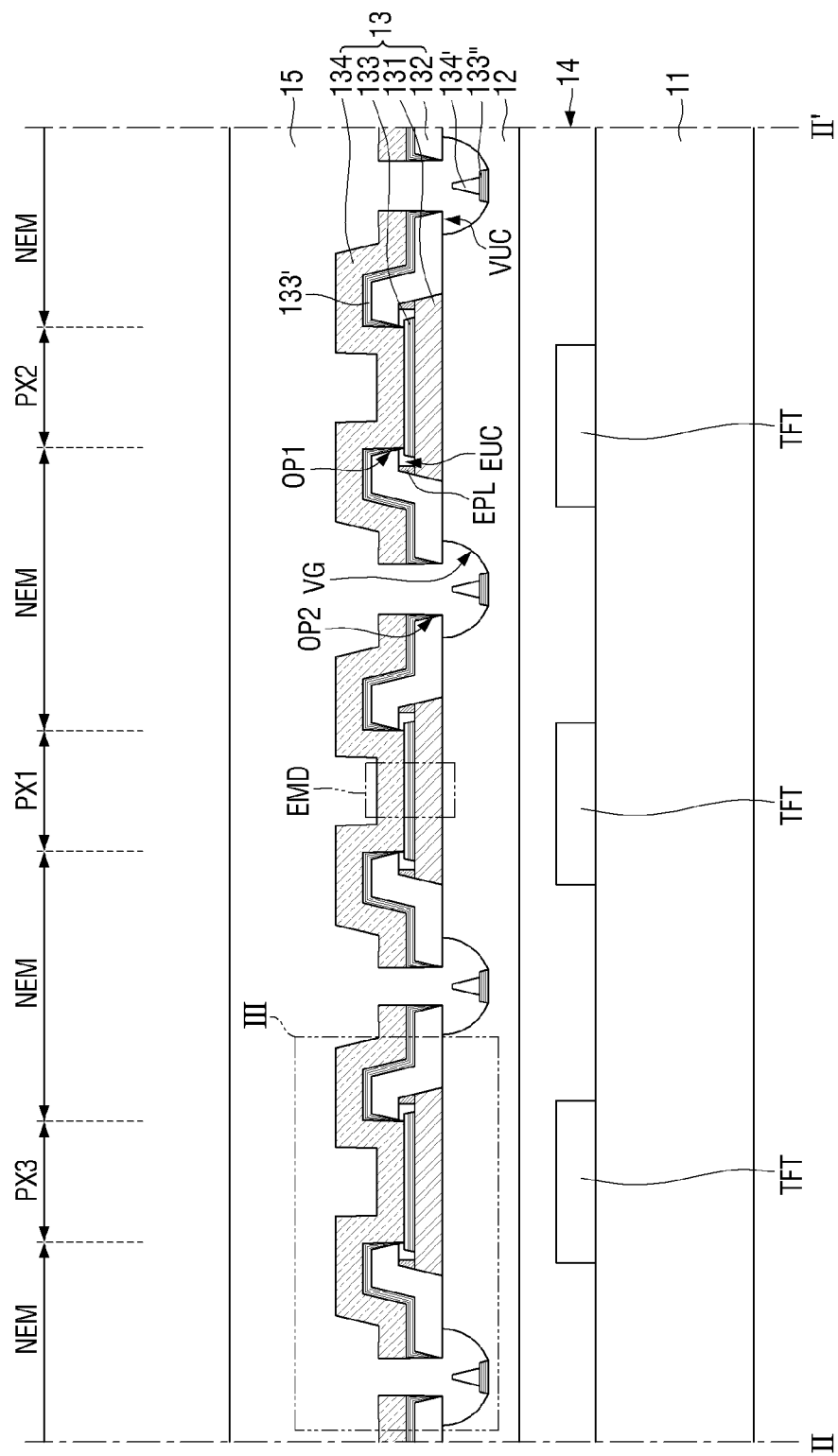
FIG. 8 is a cross-sectional view illustrating an example taken along line II-II' of FIG. 7.
Figure 9:
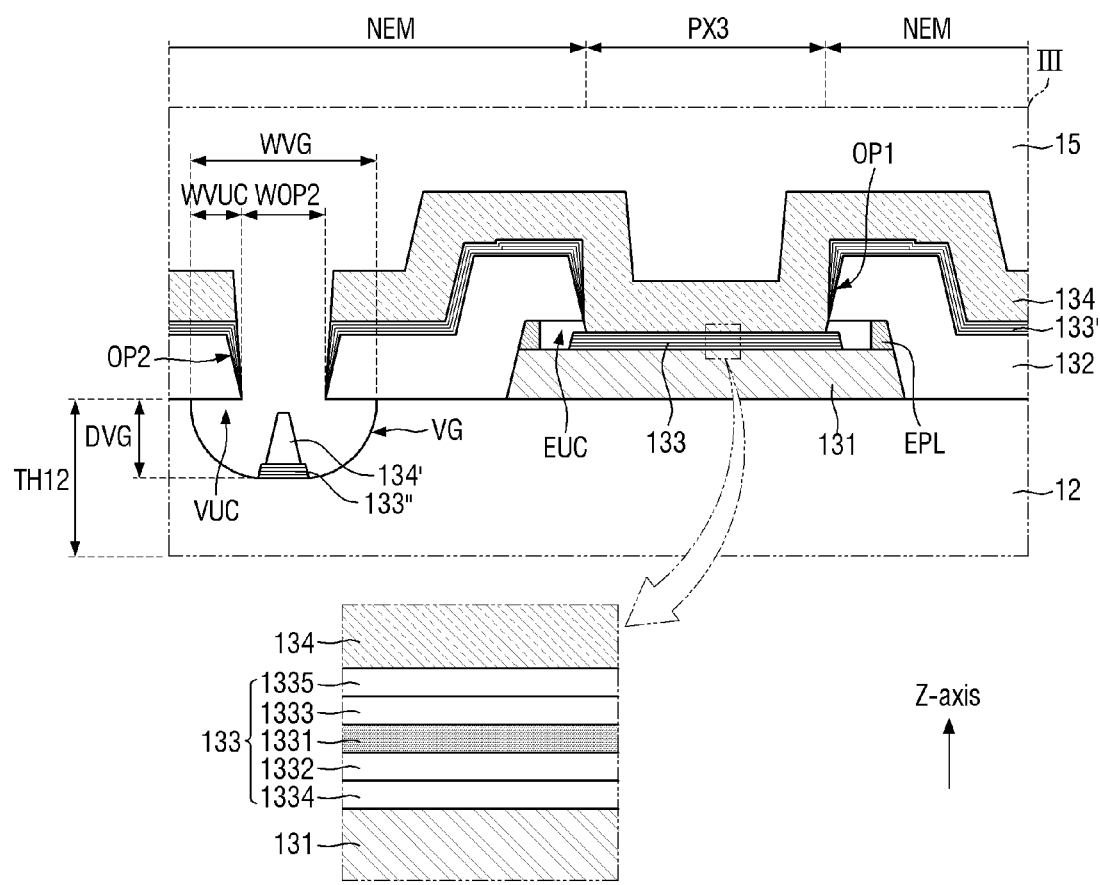
FIG. 9 is an enlarged view illustrating portion III of FIG. 8.

FIG. 6 is a plan view illustrating an example of a plurality of pixel areas arranged in a display area of FIG. 3. FIG. 7 is a plan view illustrating an example of an arrangement of first electrodes and first and second opening parts in a display panel of FIG. 6. FIG. 8 is a cross-sectional view illustrating an example taken along line II-IF of FIG. 7. FIG. 9 is an enlarged view illustrating portion III of FIG. 8.

Referring to FIG. 6 the display panel 10 includes a plurality of pixel areas PX arranged in a matrix form in the display area DA.

Each of the plurality of pixel areas PX emits light of any one of two or more different colors. As an example, each of the plurality of pixel areas PX may emit light of any one of red, green, and blue. Alternatively, each of the plurality of pixel areas PX may emit light of any one of red, green, blue, and white.

A unit pixel area UPX, which is an area displaying various colors including white, may be implemented by a combination of two or more pixel areas adjacent to each other and emitting light of different colors among the plurality of pixel areas PX.

As an example, as illustrated in FIG. 6, the plurality of pixel areas PX may include first pixel areas PX1 emitting red light, second pixel areas PX2 emitting green light, and third pixel areas PX3 emitting blue light.

In addition, since luminance control of blue light is not easy as compared with red light and green light, an arrangement ratio of the third pixel areas PX3 may be higher than those of the first and second pixel areas PX1 and PX2.

As an example, the display area DA may include first horizontal lines in which the first and second pixel areas PX1 and PX2 are alternately disposed in the left and right direction and second horizontal lines in which the third pixel areas PX3 are disposed side by side in the left and right direction. In addition, the first horizontal lines and the second horizontal lines may be alternately disposed in the up and down direction in the display area DA.

In this case, one unit pixel area UPX may be implemented through a combination of one first pixel area PX1 and one second pixel area PX2 adjacent to each other in the left and right direction and two third pixel areas PX3 adjacent to the one first pixel area PX1 and the one second pixel area PX2 in the up and down direction.

However, the plurality of pixel areas PX illustrated in FIG. 6 are only an example, and the display panel 10 according to an embodiment may include a plurality of pixel areas arranged in a different form from that illustrated in FIG. 6.

The display panel 10 is not limited to that illustrated in FIG. 6, and may include a plurality of pixel areas PX arranged in various forms.

As an example, pixel lines in which the first, second, and third pixel areas PX1, PX2, and PX3 are arranged side by side in the left and right direction or the up and down direction, respectively, may be alternately disposed in a direction crossing an arrangement direction of the pixel areas. In this case, one unit pixel area may be implemented by the first, second, and third pixel areas PX1, PX2, and PX3 adjacent to each other in the up and down direction or the left and right direction.

Referring to FIG. 7, the display panel 10 includes a plurality of first electrodes 131 corresponding to the plurality of pixel areas PX, respectively, first opening parts OP1 corresponding to central portions of the first electrodes 131, and a plurality of second opening parts OP2 corresponding to the periphery of each of the first electrodes 131 and spaced apart from each other.

The first opening part OP1 and the second opening part OP2 are formed to penetrate through a pixel-defining layer 132 (see FIG. 8) to be described later.

The first opening part OP1 is disposed at the central portion of the first electrode 131 of each of the plurality of pixel areas PX. Here, the central portion of the first electrode 131 corresponding to the first opening part OP1 refers to the remaining portion of the first electrode 131 excluding an edge of the first electrode 131.

The second opening parts OP2 may be disposed in portions of non-emitting areas NEM (FIG. 8) between pixel areas corresponding to different colors and neighboring to each other among the plurality of pixel areas PX.

That is, the second opening part OP2 disposed in a non-emitting area NEM between the first and second pixel areas PX1 and PX2 alternately disposed in the left and right direction may have a form of a line extending in the up and down direction.

In addition, the first and second pixel areas PX1 and PX2 and the third pixel area PX3 may be adjacent to each other in the up and down direction, and the second opening part OP2 disposed in a non-emitting area NEM between the first and second pixel areas PX1 and PX2 and the third pixel area PX3 may have a form of a line extending in the left and right direction.

Referring to FIG. 8, the display panel 10 according to an embodiment includes: a substrate 11 including a plurality of pixel areas PX1, PX2, and PX3 (see FIG. 8): PX (see FIG. 7), a via-layer 12 disposed on the substrate 11, a plurality of first electrodes 131 disposed on the via-layer 12 and corresponding to the plurality of pixel areas PX; PX1, PX2, and PX3, respectively, a pixel-defining layer 132 disposed on the via-layer 12 and made of an inorganic insulating material, first opening parts OP1 corresponding to central portions of the first electrodes 131 and penetrating through the pixel-defining layer 132, electrode undercuts EUC (here, "undercut" refers to "eaves") corresponding to the edges of the first opening parts OP1 and provided as gaps between the first electrodes 131 and the pixel-defining layer 132, a plurality of second opening parts OP2 corresponding to the periphery of each of the first electrodes 131, spaced apart from each other, and penetrating through the pixel-defining layer 132, via-grooves VG corresponding to the second opening parts OP2 and defined on an upper surface of the via-layer 12, via-undercuts VUC provided by the pixel-defining layer 132 around the second opening parts OP2 and the via-layer 12 around the via-grooves VG, an emitting structure 133 disposed on the first electrodes 131 and the pixel-defining layer 132, and a second electrode 134 corresponding to the plurality of pixel areas PX: PX1, PX2, and PX3 and disposed on the emitting structure 133 and the pixel-defining layer 132.

In addition, the display panel 10 according to an embodiment may further include a circuit layer 14 disposed on the substrate 11, including a plurality of thin film transistors TFT corresponding to the plurality of pixel areas PX: PX1, PX2, and PX3, and covered with the via-layer 12.

The substrate 11 may be made of an insulating material. As an example, the substrate 11 may be made of an insulating material such as glass, quartz, or a polymer resin. Here, examples of the polymer resin may include polyethersulphone ("PES"), polyacrylate ("PA"), polyarylate ("PAR"), poly etherimide ("PEI"), polyethylene naphthalate ("PEN"), polyethylene terepthalate ("PET"), polyphenylene sulfide ("PPS"), polyallylate, polyimide ("PI"), polycarbonate ("PC"), cellulose triacetate ("CAT"), cellulose acetate propionate ("CAP"), or combinations thereof.

In order to firmly support components of the display panel 10, the substrate 11 may be formed to have rigidity.

Alternatively, the substrate 11 may be made of a flexible insulating material that is easily deformed, for example, bent, folded, and rolled, for easy deformation of the display panel 10.

Alternatively, the substrate 11 may be made of a metal material.

The circuit layer 14 includes the plurality of thin film transistors TFT corresponding to the plurality of pixel areas PX: PX1, PX2, and PX3.

As an example, when each of the plurality of pixel areas PX: PX1, PX2, and PX3 includes the pixel driving circuit having the 2T1C structure as illustrated in FIG. 4, the circuit layer 14 may include first and second thin film transistors TFT1 and TFT2 and one storage capacitor CST corresponding to each of the plurality of pixel areas PX: PX1, PX2, and PX3.

For example, the thin film transistor TFT included in the circuit layer 14 may include a semiconductor layer (not illustrated) including a channel region and a source region and a drain region disposed on opposite sides of the channel region, respectively, a gate electrode (not illustrated) insulated from the semiconductor layer and overlapping the channel region of the semiconductor layer, a source electrode (not illustrated) insulated from the gate electrode and connected to the source region of the semiconductor layer, and a drain electrode (not illustrated) insulated from the gate electrode and connected to the drain region of the semiconductor layer.

In addition, the circuit layer 14 may further include an interlayer-insulating layer (not illustrated) covering the thin film transistors TFT.

The via-layer 12 corresponds to at least the display area DA and is disposed on the circuit layer 14 including the plurality of thin film transistors TFTs. Such a via-layer 12 covers the circuit layer 14.

The via-layer 12 may be formed at a thickness enough to remove a step due to the circuit layer 14 and electrically separate the circuit layer 14 and the emitting device layer 13 from each other.

Accordingly, the via-layer 12 may include an organic insulating material that is relatively easy to be thickly disposed.

Examples of the organic insulating materials may include a polyacrylates resin, an epoxy resin, a phenolic resin, a polyamides resin, a polyimides resin, an unsaturated polyesters resin, a polyphenyleneethers resin, a polyphenylenesulfides resin, benzocyclobutene ("BCB"), or the like.

The via-layer 12 may further include a photosensitive material in order to reduce external light reflection by the circuit layer 14.

The first electrode 131 may have a position and a width corresponding to each pixel area PX: PX1, PX2, and PX3.

The first electrode 131 may include at least one low-resistance metal material of copper (Cu), silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), and mixtures thereof.

Alternatively, the first electrode 131 may have a structure in which a conductive layer made of a low-resistance metal material and a conductive layer made of a transparent conductive material are stacked. As an example, the first electrode 131 may have a multilayer structure such as indium tin oxide ("ITO")/Mg, ITO/MgF, ITO/Ag, and ITO/Ag/ITO.

The first electrode 131 may be an anode electrode of the emitting device EMD. That is, the first electrode 131 may be connected to the thin film transistor TFT of the circuit layer 14 through a hole (not illustrated) penetrating through at least the via-layer 12.

The pixel-defining layer 132 corresponds to at least the display area DA, and is disposed on the via-layer 12. The pixel-defining layer 132 covers at least a portion of each of the plurality of first electrodes 131 corresponding to the plurality of pixel areas PX: PX1, PX2, and PX3. The pixel-defining layer 132 may cover at least edges of each of the first electrodes 131.

The pixel-defining layer 132 is made of an inorganic insulating material. As an example, the pixel-defining layer 132 may include at least one inorganic insulating material of silicon nitride, aluminum nitride, zirconium nitride, titanium nitride, hafnium nitride, tantalum nitride, silicon oxide, aluminum oxide, titanium oxide, tin oxide, and silicon oxynitride.

Since the pixel-defining layer 132 is made of the inorganic insulating material as described above, oxidation of the second electrode 134 due to an outgas of the via-layer 12 may be delayed.

That is, since the via-layer 12 is made of the organic insulating material to emit the outgas, when the pixel-defining layer 132 disposed between the via-layer 12 and the second electrode 134 is made of the organic insulating material, it becomes easy for the outgas to reach the second electrode 134.

In this case, metal particles included in the second electrode 134 may be oxidized due to the outgas, such that resistance characteristics of the second electrode 134 may be deteriorated. In addition, a range in which the metal particles of the second electrode 134 are oxidized due to the outgas is diffused from edges of the pixel areas PX: PX1, PX2, and PX3 adjacent to the via-layer 12 to the center, such that widths of areas from which light is substantially emitted in the pixel areas PX: PX1, PX2, and PX3 may be shrunk due to the deterioration of the electrical characteristics of the second electrode 134. Accordingly, a decrease in luminance, pixel defects, and the like, may be caused, such that a display quality and a lifespan of the display panel 10 may be deteriorated.

However, according to an embodiment, the outgas from the via-layer 12 may be prevented from being transferred to the second electrode 134 by the pixel-defining layer 132 made of the inorganic insulating material. Therefore, the oxidation of the second electrode 134 due to the outgas of the via-layer 12 may be delayed, and thus, shrinkage of emitting areas of the pixel areas PX: PX1, PX2, and PX3 due to the oxidation of the second electrode 134 may be delayed. Accordingly, a display quality and a lifespan of the display panel 10 may be effectively improved.

Referring to FIG. 9, the first opening part OP1 may be formed by removing the pixel-defining layer 132 covering a central portion of the first electrode 131.

The first opening part OP1 may correspond to an effective area from which the light is substantially emitted in each of the pixel areas PX: PX1, PX2, and PX3. That is, an emitting device EMD having a structure in which the emitting structure 133 is disposed between the first and second electrodes 131 and 134 may be implemented in the first opening part OP1.

The electrode undercut EUC corresponds to the edge of the first opening part OP1 and is provided as the gap between the pixel-defining layer 132 and the first electrode 131.

In addition, the display panel 10 according to an embodiment may further include an electrode protection layer EPL corresponding to the edge of the electrode undercut EUC, disposed on the edge of the first electrode 131, and covered with the pixel-defining layer 132.

The electrode protection layer EPL is provided in order to reduce damage to the first electrode 131 due to an etching material removing the pixel-defining layer 132 in a process of disposing the first opening part OP1.

That is, the first electrode 131 is made of a conductive inorganic material and the pixel-defining layer 132 is made of the inorganic insulating material, and thus, a surface of the first electrode 131 exposed through the first opening part OP may be patterned with an etching material for the pixel-defining layer 132 together with the pixel-defining layer 132.

In this case, electrical characteristics of the plurality of first electrodes 131 corresponding to the plurality of pixel areas PX: PX1, PX2, and PX3, respectively, may become different from each other according to a damage degree of the surface of the first electrode 131 due to the etching material. Therefore, uniformity of light emitting characteristics of the plurality of emitting devices EMD may be deteriorated, and thus, a display quality of the display panel 10 may be deteriorated.

Accordingly, the display panel 10 according to an embodiment includes the electrode protection layer EPL for protecting the first electrode 131 from the etching material for the pixel-defining layer 132.

Before a process of disposing the first opening part OP1 is performed, the electrode protection layer EPL is disposed on the first electrode 131, such that the surface of the first electrode 131 may not be exposed to the etching material for the pixel-defining layer 132 during the process of disposing the first opening part OP1. Accordingly, damage to the surface of the first electrode 131 caused by the disposition of the first opening part OP1 may be reduced.

Since the electrode protection layer EPL is provided to protect the first electrode 131 from the etching material for the pixel-defining layer 132, the electrode protection layer EPL may be made of a material of which an etching ratio by the etching material for the pixel-defining layer 132 is higher than that of the first electrode 131.

In addition, in order to provide the electrode undercut EUC forming the gap between the first electrode 131 and the pixel-defining layer 132 around the first opening part OP1, the electrode protection layer EPL may be made of a material of which an etching ratio by the etching material for the pixel-defining layer 132 is slightly higher than that of the pixel-defining layer 132.

For example, the electrode protection layer EPL may be made of at least one of In—Zn—O ("IZO") and In—Ga—Zn—O ("IGZO").

Since the electrode protection layer EPL is provided to protect the first electrode 131 from the etching material for the pixel-defining layer 132, a width of the electrode protection layer EPL may correspond to a width of the first opening part OP1, the etching ratio by the etching material for the pixel-defining layer 132, and the like.

When the first opening part OP1 is disposed, the electrode protection layer EPL is exposed to the etching material for the pixel-defining layer 132 through the first opening part OP1. In this case, the electrode undercut EUC is disposed by removing a portion corresponding to the first opening part OP1 and the periphery of the first opening part OP1 in the electrode protection layer EPL disposed on the first electrode 131 with the etching material for the pixel-defining layer 132.

The electrode undercut EUC corresponds to the edge of the first opening part OP1 and is provided as the gap between the first electrode 131 and the pixel-defining layer 132. In the electrode undercut EUC, the first electrode 131 and the pixel-defining layer 132 are spaced apart from each other while directly facing each other.

Since the first opening part OP1 corresponds to the central portion of the first electrode 131, the edge of the first electrode 131 is covered with the pixel-defining layer 132.

When the electrode protection layer EPL is disposed to have a width corresponding to the first opening part OP1 and the electrode undercut EUC, the electrode protection layer EPL may be in a state in which it is completely removed when the electrode undercut EUC is disposed.

In this case, the electrode undercut EUC may be provided by a structure in which the pixel-defining layer 132 corresponding to the periphery of the first opening part OP1 is spaced apart from an upper portion of the first electrode 131 and directly faces the upper portion of the first electrode 131.

Alternatively, when the electrode protection layer EPL is disposed to have a width greater than a width corresponding to the first opening part OP1 and the electrode undercut EUC, a portion of the electrode protection layer EPL may remain on the edge of the first electrode 131 after the electrode undercut EUC is disposed.

In this case, the remaining electrode protection layer EPL may be disposed on the edge of the first electrode 131 and be covered with the pixel-defining layer 132.

In this case, the electrode undercut EUC may be provided by a structure in which a lower surface of the pixel-defining layer 132 corresponding to the periphery of the first opening part OP1 protrudes from a side surface of the electrode protection layer EPL to directly face the upper portion of the first electrode 131 while being spaced apart from the first electrode 131.

The second opening part OP2 is disposed around the first electrode 131 and penetrates through the pixel-defining layer 132.

As illustrated in FIG. 7, the second opening parts OP2 are disposed in the non-emitting areas NEM between the pixel areas for emitting light of different colors and neighboring to each other (e.g., between PX1 and between PX2, PX1 and PX3, and between PX2 and PX3), and have forms of lines extending in parallel with the edges of the first electrodes 131.

The plurality of second opening parts OP2 disposed around the first electrode 131 are spaced apart from each other. That is, the periphery of the first electrode 131 is not completely surrounded by the plurality of second opening parts OP2.

In addition, as illustrated in FIG. 8, the second opening part OP2 may be formed by removing the pixel-defining layer 132, similar to the first opening part OP1.

The via-groove VG may be formed to penetrate through at least a portion of the via-layer 12 corresponding to the second opening part OP2.

In this case, a depth DVG of the via-groove VG may be less than a thickness TH12 of the via-layer 12. That is, the via-groove VG may have a shape in which it penetrates through the entire via-layer 12 or a shape in which it penetrates through only a portion of the via-layer 12.

The depth DVG of the via-groove VG may be set in consideration of an etching form and an etching rate of the via-layer 12 by an etching material, a width WVG of the via-groove VG, and the like.

The width WVG of the via-groove VG exceeds a width WOP2 of the second opening part OP2. Therefore, the via-undercut VUC having a structure in which a lower surface of the pixel-defining layer 132 corresponding to the periphery of the second opening part OP2 protrudes from an upper surface of the via-layer 12 corresponding to the periphery of the via-groove VG may be provided. Here, "depth" and "thickness" are measured in the Z-axis direction, and "width" is measured in a certain direction perpendicular to the Z-axis direction.

The via-undercut VUC is for partially separating the emitting structure 133 and the second electrode 134 disposed on the pixel-defining layer 132. To this end, a width WVUC of the via-undercut VUC may be about 0.35 μm or more.

Here, the width WVUC of the via-undercut VUC may refer to a width by which the pixel-defining layer 132 corresponding to an edge of the second opening part OP2 protrudes from the via-layer 12 corresponding to an edge of the via-groove VG.

In addition, a ratio of the width WVUC of the via-undercut VUC to a height of the via-undercut VUC (i.e., the depth DVG of the via-groove VG) may be equal to or more than about 50% and less than about 100%. That is, an etching material for the via-layer 12 for an arrangement of the via-grooves VG may be a material of which an etching ratio in a horizontal direction to an etching ratio in a vertical direction is 0.5 or more. As an example, the arrangement of the via-grooves VG may be implemented by an isotropic dry etching process.

Accordingly, in order to secure the width WVUC of the via-undercut VUC of about 0.35 μm or more, the height of the via-undercut VUC (i.e., the depth DVG of the via-groove VG) may be about 0.7 μm or more.

In this case, it is possible secure the width WVUC of the via-undercut VUC so as to prevent the via-groove VG from extending below the via-layer 12 and enough to allow each of the emitting structure 133 and the second electrode 134 from being partially separated. Accordingly, damage to a component disposed below the via-layer 12 due to the via-groove VG may be effectively prevented.

The emitting structure 133 is disposed on the first electrode 131 and the pixel-defining layer 132.

The emitting structure 133 may be made of an organic material.

The emitting structure 133 may include an emitting layer 1331 in which holes and electrons supplied from the first and second electrodes 131 and 134 facing each other are combined with each other to emit light, a hole transport layer 1332 disposed between the first electrode 131 and the emitting layer 1331, and an electron transport layer 1333 disposed between the second electrode 134 and the emitting layer 1331.

In order to independently control luminance and a color in each of the plurality of pixel areas PX: PX1, PX2, and PX3, the emitting layer 1331 corresponds to each of the plurality of pixel areas PX: PX1, PX2, and PX3.

The emitting layer 1331 may include a dopant material and a host material corresponding to a color corresponding to each of the plurality of pixel areas PX: PX1, PX2, and PX3.

The hole transport layer 1332 may include a host material transporting holes to the emitting layer 1331.

The electron transport layer 1333 may include a host material transporting electrons to the emitting layer 1331.

The hole transport layer 1332 and the electron transport layer 1333 do not need to correspond to each of the plurality of pixel areas PX: PX1, PX2, and PX3, and thus, are equally and commonly disposed in the plurality of pixel areas PX: PX1, PX2, and PX3.

In addition, as illustrated in FIG. 9, the emitting structure 133 may further include a hole injection layer 1334 disposed between the hole transport layer 1332 and the first electrode 131 or an electron injection layer 1335 disposed between the electron transport layer 1333 and the second electrode 134.

The hole injection layer 1334 may include a host material injecting holes supplied from the first electrode 131 into the hole transport layer 1332.

The electron injection layer 1335 may include a host material injecting electrons supplied from the second electrode 134 into the electron transport layer 1333.

Each of the hole injection layer 1334 and the electron injection layer 1335 is equally and commonly disposed in the plurality of pixel areas PX: PX1, PX2, and PX3.

The second electrode 134 entirely corresponds to the plurality of pixel areas PXs PX1, PX2, and PX3, and is disposed on the emitting structure 133.

The second electrode 134 may include a transparent metal oxide material such as ITO, IZO, and IGZO.

In addition, the display panel 10 according to an embodiment may further include an encapsulation structure 15 covering the emitting device layer 13.

The encapsulation structure 15 seals the emitting device layer 13 to prevent oxygen or moisture from penetrating into the emitting structure 133.

The encapsulation structure 15 may have a structure in which insulating layers having different materials or different thicknesses are stacked. As an example, the encapsulation structure 15 may have a structure in which at least one inorganic insulating layer and at least one organic insulating layer are alternately disposed.

Unlike the first electrodes 131 and the emitting layers 1331 individually disposed in the plurality of pixel areas PX: PX1, PX2, and PX3, the hole transport layer 1332, the hole injection layer 1334, and the like, disposed between the first electrodes 131 and the emitting layers 1331 are common layers entirely disposed in the plurality of pixel areas PX: PX1, PX2, and PX3. Such common layers induce a leakage current between neighboring pixel areas.

When the leakage current is generated between the neighboring pixel areas, it becomes difficult to independently drive the plurality of pixel areas PX: PX1, PX2, and PX3. That is, emitting devices EMD of some pixel areas may emit light by driving currents supplied to emitting devices of pixel areas neighboring to some pixel areas. In particular, when a leakage current is generated between pixel areas corresponding to different colors and neighboring to each other, accuracy of color display may be deteriorated and a display quality may be deteriorated.

The display panel 10 according to an embodiment includes the electrode undercuts EUC and the via-undercuts VUC in order to prevent the leakage current from flowing between the neighboring pixel areas through the common layer such as the hole transport layer 1332 or the like.

The emitting structure 133 is disposed on the first electrode 131 and the pixel-defining layer 132. The hole transport layer 1332, the electron transport layer 1333, and the like, other than the emitting layers 1331 corresponding to the plurality of pixel areas PX: PX1, PX2, and PX3, respectively, in the emitting structure 133 are common layers entirely corresponding to the plurality of pixel areas PX: PX1, PX2, and PX3.

The electrode undercut EUC is provided as the gap between the first electrode 131 and the pixel-defining layer 132 around the first opening part OP1.

The electrode undercut EUC corresponds to the first opening part OP1, and the first opening part OP1 corresponds to the central portion of the first electrode 131. The emitting structure 133 on the first electrode 131 may be completely separated from an emitting structure 133' on the pixel-defining layer 132 by such an electrode undercut EUC to be disposed in an independent island-shaped pattern.

As described above, the emitting structure 133 on the first electrode 131 is separated from the emitting structure 133' on the pixel-defining layer 132 by the electrode undercut EUC, such that connection between the neighboring pixel areas through the common layer of the emitting structure 133 may be blocked. Therefore, the leakage current caused by the hole transport layer 1332 or the like of the emitting structure 133 may be prevented, and thus, deterioration of a display quality due to the leakage current between the neighboring pixel areas may be prevented.

In addition, the via-undercuts VUC may be disposed in the non-emitting areas NEM between the pixel areas PX1 and PX2, between the pixel areas PX1 and PX3, and between the pixel areas PX2 and PX3 corresponding to the different colors and neighboring to each other, and be provided as gaps between the pixel-defining layer 132 and the via-layer 12.

Each of the emitting structure 133 and the second electrode 134 disposed on the pixel-defining layer 132 may be partially separated in the non-emitting areas NEM between the pixel areas corresponding to the different colors and neighboring to each other (e.g., between PX1 and PX2, between PX1 and PX3, and between PX2 and PX3), by such via-undercuts VUC.

Since the emitting structure 133 and the second electrode 134 each are partially separated between the pixel areas neighboring to each other (e.g., between PX1 and PX2, between PX1 and PX3, and between PX2 and PX3) as described above, current paths between the pixel areas PX1 and PX2, between the pixel areas PX1 and PX3, and between the pixel areas PX2 and PX3 neighboring to each other may be lengthened, and thus, the generation of the leakage current may be further prevented. Therefore, deterioration of color purity due to the leakage current between the pixel areas PX1 and PX2, between the pixel areas PX1 and PX3, and between the pixel areas PX2 and PX3 corresponding to the different colors and neighboring to each other may be effectively prevented.

In addition, even though widths and gaps of the plurality of pixel areas PX are decreased, the common layer of the emitting structure 133 may be separated by the electrode undercuts EUC and the via-undercuts VUC, such that deterioration of display quality due to the leakage current between the neighboring pixel areas may be prevented, which may be advantageous in improving resolution of the display panel 10.

Next, various modified examples of an embodiment will be described.

Figure 10:
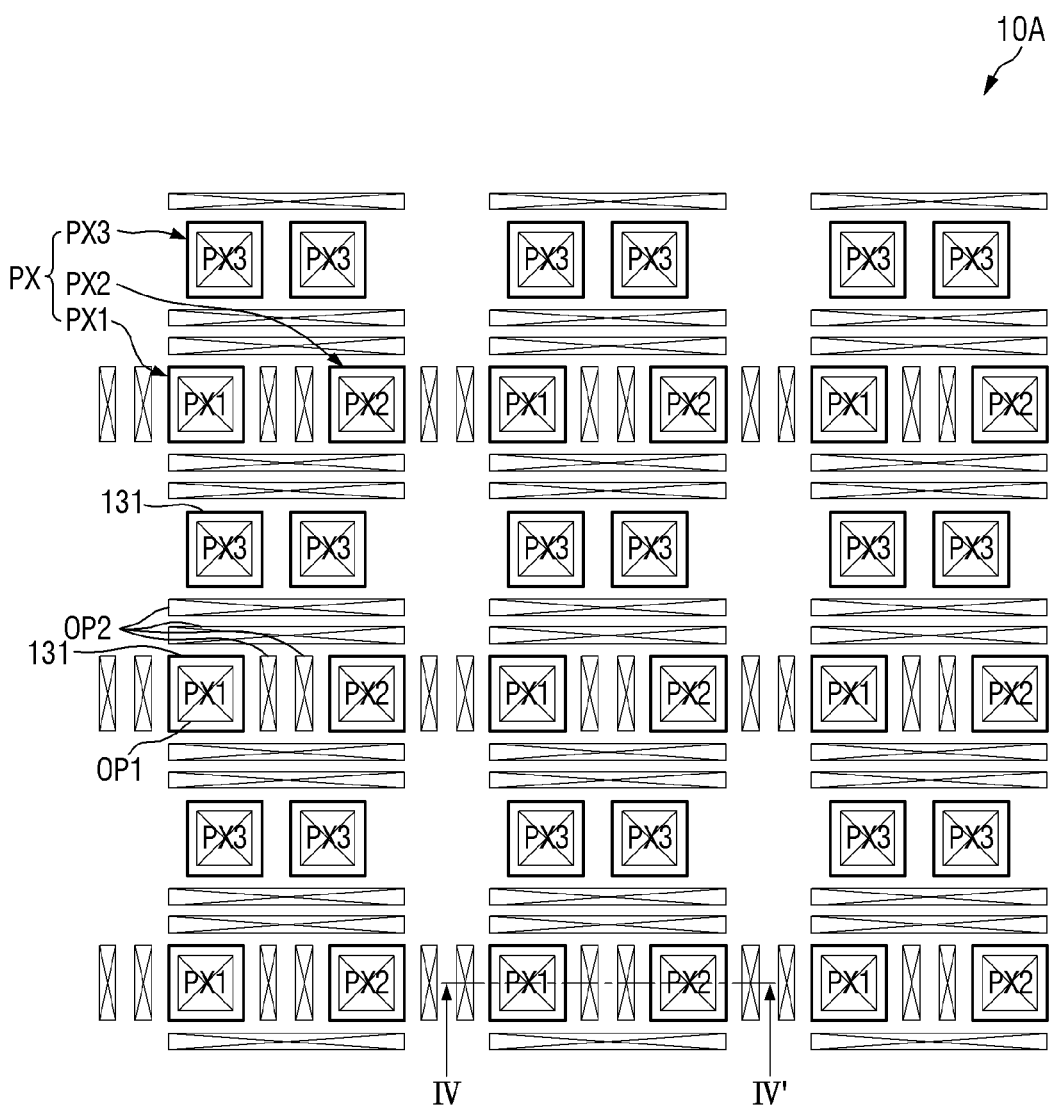
FIG. 10 is a plan view illustrating another example of an arrangement of first electrodes and first and second opening parts in a display panel of FIG. 6.
Figure 11:
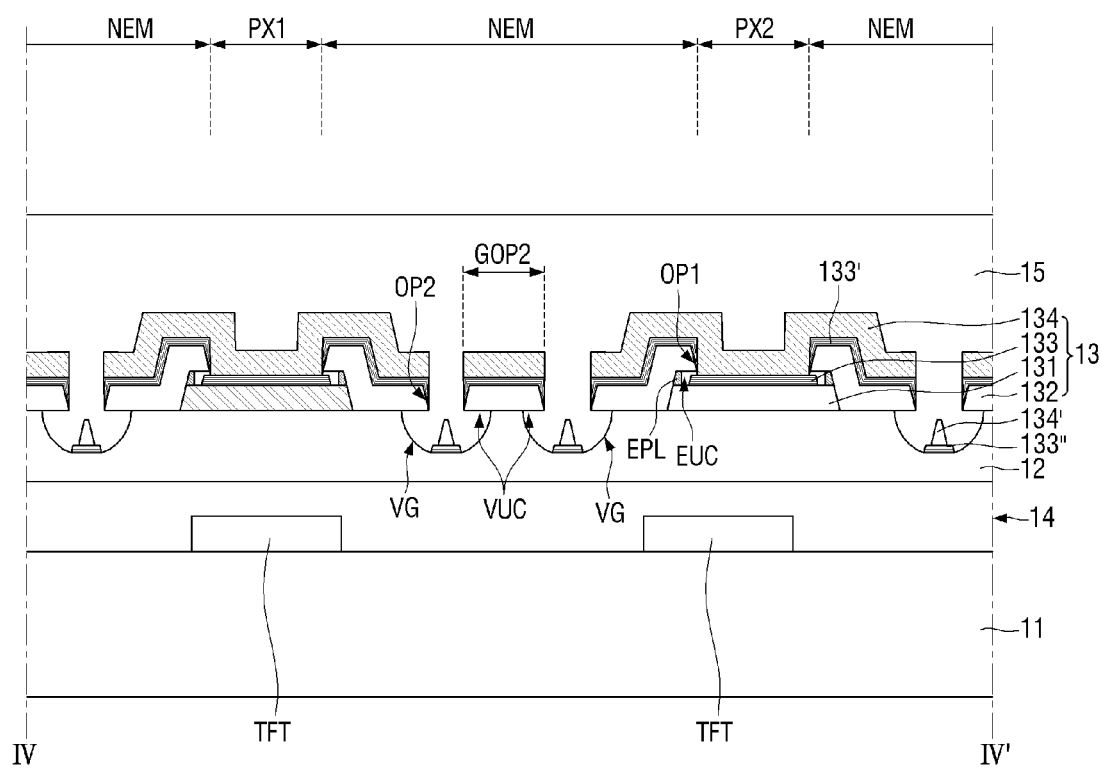
FIG. 11 is a cross-sectional view illustrating an example taken along line IV-IV' of FIG. 10.

FIG. 10 is a plan view illustrating another example of an arrangement of first electrodes and first and second opening parts in a display panel of FIG. 6. FIG. 11 is a cross-sectional view illustrating an example taken along line IV-IV' of FIG. 10.

Referring to FIGS. 10 and 11, a display panel 10A according to another embodiment is the same as the display panel 10 according to an embodiment illustrated in FIGS. 1 to 9 except that two or more opening parts OP2 are disposed in non-emitting areas NEM between pixel areas corresponding to different colors and neighboring to each other (e.g., between PX1 and between PX2, PX2 and PX3, and between PX1 and PX3), and an overlapping description is thus omitted.

Via-undercuts VUC are disposed at edges of the second opening parts OP2, and have a width WVUC of about 0.35 μm or more.

Accordingly, a gap GOP2 of any two second opening parts OP2 disposed in parallel with each other in the non-emitting areas NEM between the pixel areas PX1 and PX2, between the pixel areas PX2 and PX3, and between the pixel areas PX1 and PX3 corresponding to the different colors and neighboring to each other may be set in consideration of the width WVUC of two via-undercuts VUC and a gap of the two via-undercuts VUC. As an example, when the width WVUC of the via-undercut VUC is about 0.35 μm or more, the gap GOP2 of any two second opening parts OP2 disposed in parallel with each other in the non-emitting areas NEM between the pixel areas PX1 and PX2, between the pixel areas PX2 and PX3, and between the pixel areas PX1 and PX3 corresponding to the different colors and neighboring to each other may be about 1 μm or more.

As described above, according to an example of FIGS. 10 and 11, the two or more via-undercuts VUC by two or more second opening parts OP2 parallel to each other are disposed in the non-emitting areas NEM between the pixel areas PX1 and PX2, between the pixel areas PX2 and PX3, and between the pixel areas PX1 and PX3 corresponding to the different colors and neighboring to each other, such that partial separation of the emitting structure 133 and the second electrode 134 may be implemented twice or more. Therefore, reliability may be effectively improved in preventing a leakage current between the pixel areas corresponding to the different colors and neighboring to each other (e.g., between PX1 and PX2, between PX1 and PX3, and between PX2 and PX3).

Figure 12:
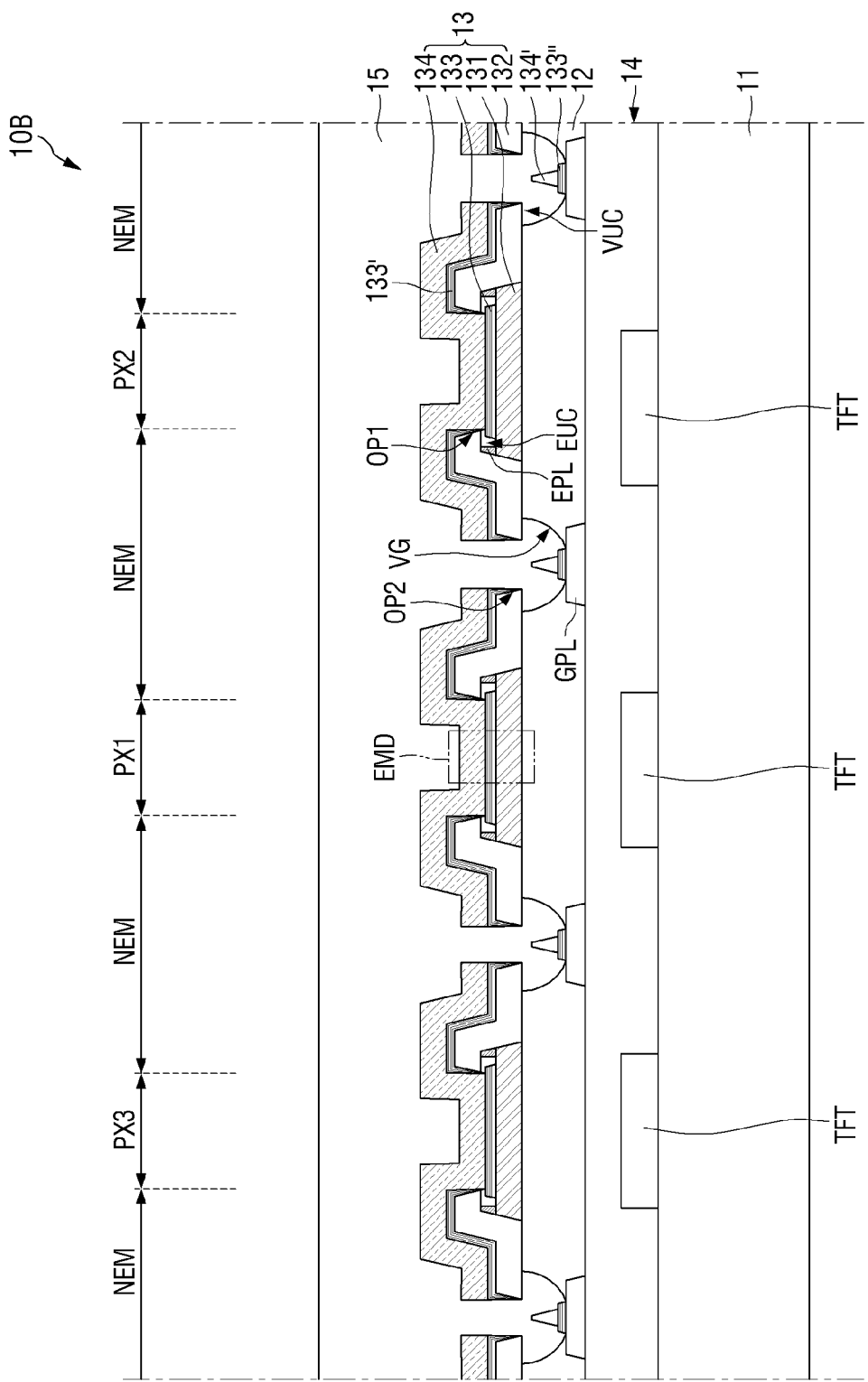
FIG. 12 is a cross-sectional view illustrating another example taken along line II-II' of FIG. 7.

FIG. 12 is a cross-sectional view illustrating another example taken along line II-II' of FIG. 7.

Referring to FIG. 12, a display panel 10B according to still another embodiment is the same as the display panel 10 according to an embodiment illustrated in FIGS. 1 to 9 except that it further includes groove protection layers GPL disposed between the circuit layer 14 and the via-layer 12, and an overlapping description is thus omitted.

The circuit layer 14 includes a plurality of thin film transistors TFT disposed on the substrate 11 and corresponding to the plurality of pixel areas PX: PX1, PX2, and PX3. The circuit layer 14 may further include an interlayer-insulating layer (not illustrated) covering the plurality of thin film transistors TFT.

The groove protection layers GPL are disposed in portions of non-emitting areas NEM between pixel areas PX1 and PX2, between the pixel areas PX1 and PX3, and between the pixel areas PX2 and PX3 corresponding to different colors and neighboring to each other.

The groove protection layers GPL are disposed on the circuit layer 14. In this case, the via-layer 12 is disposed on the circuit layer 14 and covers the groove protection layers GPL.

At least portions of the groove protection layers GPL are exposed to the via-grooves VG.

That is, the groove protection layers GPL are provided as etching prevention means of the circuit layer 14 corresponding to the via-grooves VG.

As described above, it is possible to block the via-grooves VG from extending and damaging to the circuit layer 14, by the groove protection layers GPL.

Figure 13:
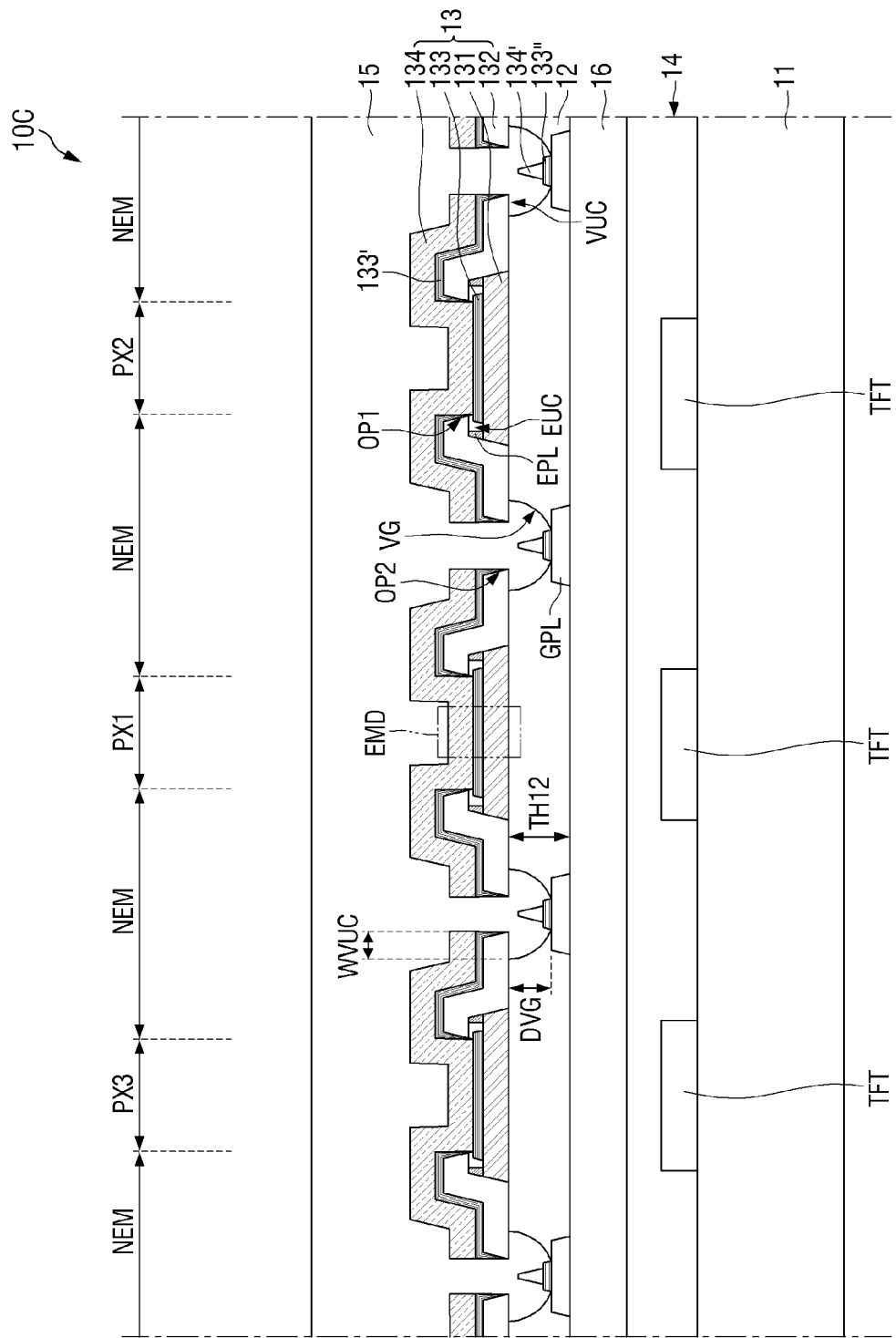
FIG. 13 is a cross-sectional view illustrating still another example taken along line II-II' of FIG. 7.

FIG. 13 is a cross-sectional view illustrating still another example taken along line II-II' of FIG. 7.

Referring to FIG. 13, a display panel 10C according to a third embodiment is the same as the display panel 10B according to still another embodiment illustrated in FIG. 12 except that it further includes an auxiliary via-layer 16 disposed between the circuit layer 14 and the via-layer 12, and an overlapping description is thus omitted.

The auxiliary via-layer 16 is disposed on the circuit layer 14, and the groove protection layers GPL are disposed on the auxiliary via-layer 16.

The via-layer 12 is disposed on the auxiliary via-layer 16 and covers the groove protection layers GPL.

The auxiliary via-layer 16 may be made of the same material as the via-layer 12.

A depth DVG of the via-groove VG may be limited to be within a thickness TH12 of the via-layer 12 by the auxiliary via-layer 16 and the groove protection layer GPL. In other words, the depth DVG of the via-groove VG may be limited to a value obtained by subtracting a thickness of the groove protection layer GPL from the thickness TH12 of the via-layer 12.

Therefore, even though over-etching is performed on the via-layer 12 in order to provide the via-groove VG having a relatively great width, it is possible to prevent the depth DVG of the via-groove VG from becoming excessively great.

Accordingly, it may be easy to increase the width WVUC of the via-undercut VUC while preventing damage to the circuit layer 14 due to the via-groove VG. In addition, as the width WVUC of the via-undercut VUC increases, partial separation of the emitting structure 133 and the second electrode 134 in the non-emitting areas NEM between the pixel areas corresponding to the different colors and neighboring to each other (e.g., between PX1 and PX2, between PX1 and PX3, and between PX2 and PX3) may be more reliably realized.

In addition, a distance between the circuit layer 14 and the via-groove VG spaced apart from each other may be secured by a thickness or more of the auxiliary via-layer 16, and thus, the circuit layer 14 may be further protected.

Next, a method for fabricating a display panel according to an embodiment will be described.

Figure 14:
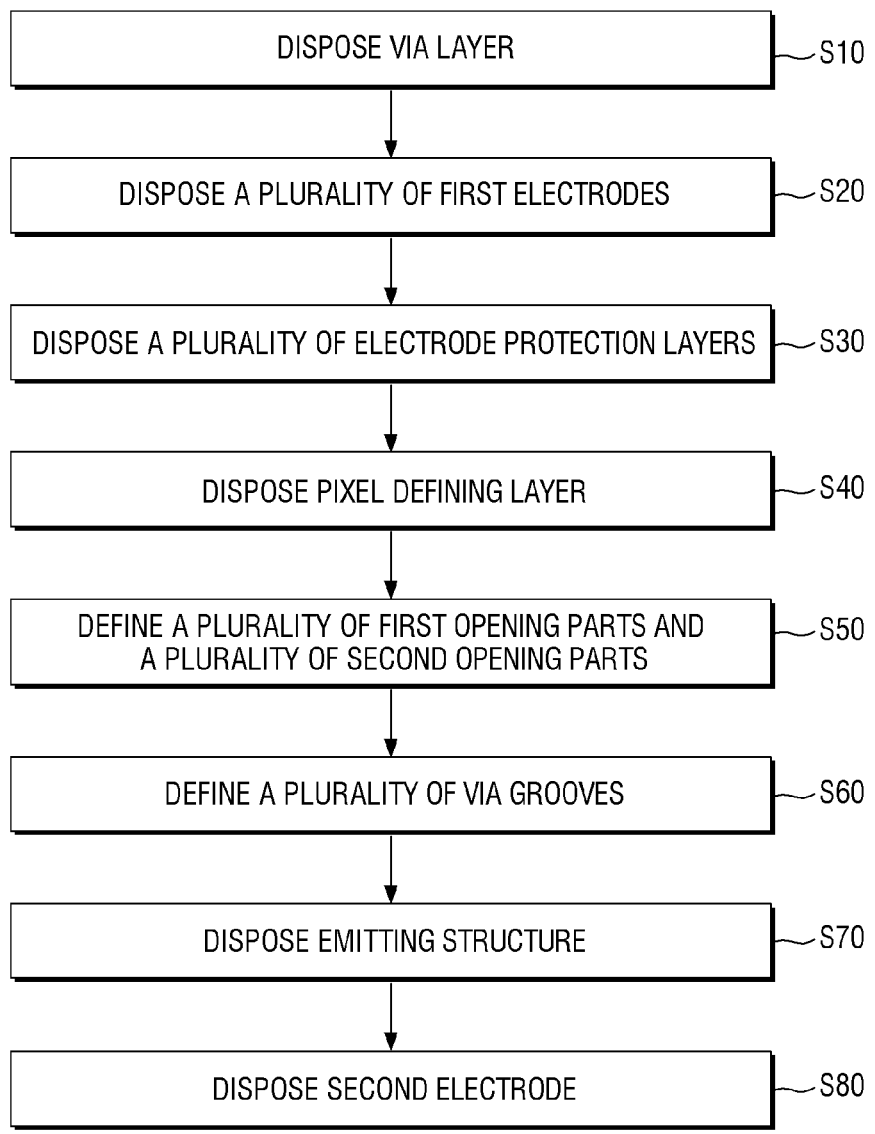
FIG. 14 is a flowchart illustrating a method for fabricating a display panel according to an embodiment.

FIG. 14 is a flowchart illustrating a method for fabricating a display panel according to an embodiment. FIGS. 15 to 28 are cross-sectional views for each step of FIG. 14.

The cross-sectional views for each step illustrated in FIGS. 15 to 28 are based on that illustrated in FIG. 9.

Referring to FIG. 14, a method for fabricating the display panel 10 according to an embodiment may include disposing a via-layer 12 on a substrate 11 including a plurality of pixel areas PX (S10), disposing a plurality of first electrodes 131 corresponding to the plurality of pixel areas PX, respectively, on the via-layer 12 (S20), disposing a plurality of electrode protection layers EPL on the plurality of first electrode 131, respectively (S30), disposing a pixel-defining layer 132 covering the plurality of first electrodes 131 and the plurality of electrode protection layers EPL by applying an inorganic insulating material onto the via-layer 12 (S40), disposing a plurality of first opening parts OP1 and a plurality of second opening parts OP2 by patterning the pixel-defining layer 132, the plurality of first opening parts OP1 corresponding to central portions of the plurality of first electrodes 131, respectively, and the plurality of second opening parts OP2 corresponding to the periphery of each of the plurality of first electrodes 131 and being spaced apart from each other by patterning the pixel-defining layer 132 (S50), disposing a plurality of via-grooves VG corresponding to the plurality of second opening parts OP2, respectively, and defined on an upper surface of the via-layer 12 by patterning the via-layer 12 (S60), disposing an emitting structure 133 on the plurality of first electrodes 131 and the pixel-defining layer 132 (S70), and disposing a second electrode 134 on the emitting structure 133 (S80).

In addition, the method for fabricating the display panel 10 according to an embodiment may further include, before the disposing of the via-layer 12 (S10), disposing a circuit layer 14 on the substrate 11, the circuit layer 14 including a plurality of thin film transistors TFT corresponding to the plurality of pixel areas PX.

In addition, a method for fabricating the display panel 10B according to still another embodiment illustrated in FIG. 12 may further include, after the disposing of the circuit layer 14, disposing the groove protection layers GPL on the circuit layer 14. In this case, in the disposing of the via-layer 12 (S10), the via-layer 12 covers the groove protection layers GPL.

In addition, a method for fabricating the display panel 10C according to a third embodiment illustrated in FIG. 13 may further include, before the disposing of the groove protection layers GPL, disposing the auxiliary via-layer 16 on the circuit layer 14. In this case, in the disposing of the via-layer 12 (S10), the via-layer 12 is disposed on the auxiliary via-layer 16 and covers the groove protection layers GPL on the auxiliary via-layer 16.

Figure 15:
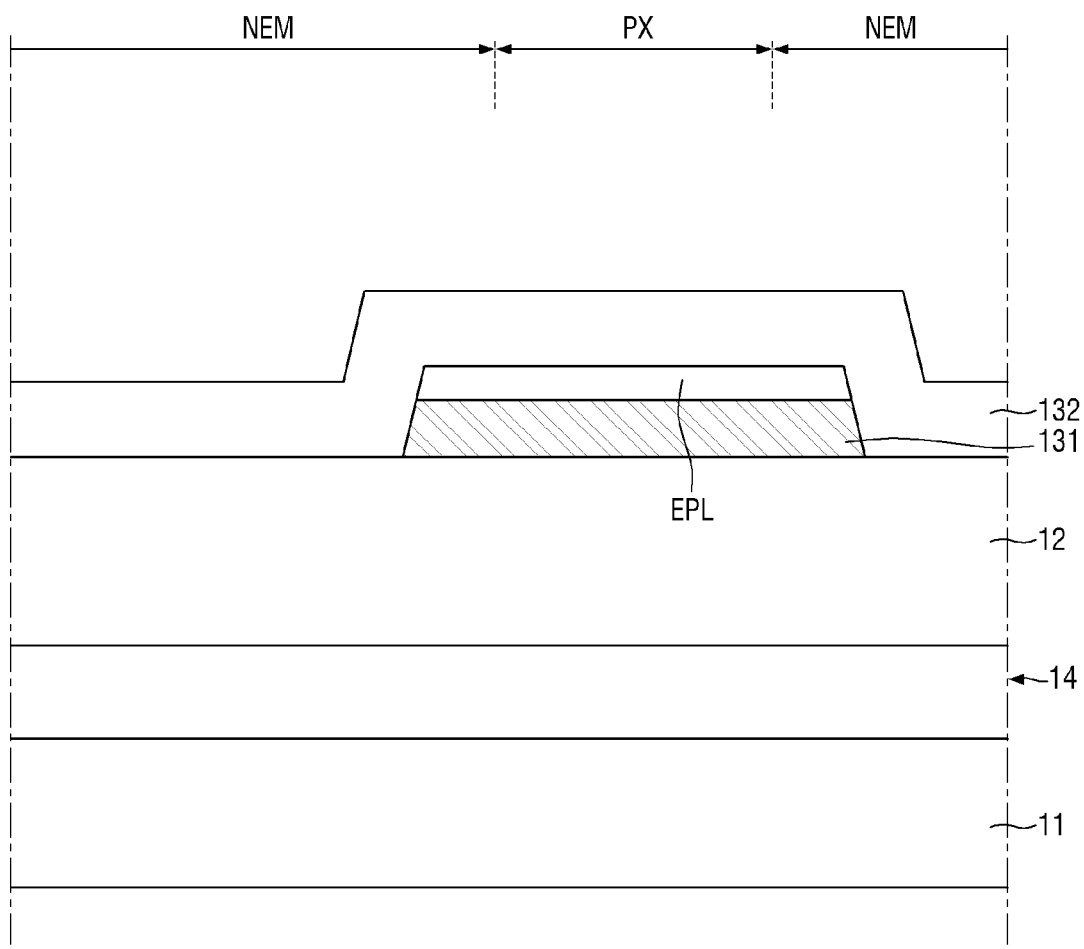
FIGS. 15 to 28 are cross-sectional views for each step of FIG. 14.

Referring to FIG. 15, the substrate 11 is prepared, the circuit layer 14 is disposed on the substrate 11, and the via-layer 12 is then disposed (S10).

The substrate 11 includes a display area DA for image display and a non-display area NDA that is a peripheral area of the display area DA, and includes a plurality of pixel areas PX arranged in a matrix form in the display area DA.

The substrate 11 may be made of a rigid or flexible insulating material or a metal material.

The circuit layer 14 includes the plurality of thin film transistors TFT corresponding to the plurality of pixel areas PX.

The via-layer 12 is disposed on the substrate 11, and covers the circuit layer 14 so as to at least correspond to the display area DA.

The via-layer 12 may be disposed at a relatively great thickness using an organic insulating material. Examples of the organic insulating materials may include a polyacrylates resin, an epoxy resin, a phenolic resin, a polyamides resin, a polyimides resin, an unsaturated polyesters resin, a polyphenyleneethers resin, a polyphenylenesulfides resin, benzocyclobutene (BCB), or the like.

Next, the plurality of first electrodes 131 corresponding to the plurality of pixel areas PX are disposed on the via-layer 12 (S20).

The disposing of the plurality of first electrodes 131 (S20) may include patterning at least one conductive film stacked on the via-layer 12.

The first electrode 131 may include at least one low-resistance metal material of copper (Cu), silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), and mixtures thereof.

Alternatively, the first electrode 131 may have a structure in which a conductive layer made of a low-resistance metal material and a conductive layer made of a transparent conductive material are stacked. As an example, the first electrode 131 may have a multilayer structure such as indium tin oxide (ITO)/Mg, ITO/MgF, ITO/Ag, and ITO/Ag/ITO.

Next, the plurality of electrode protection layers EPL are disposed on the plurality of first electrodes 131 (S30).

Alternatively, unlike illustrated in FIG. 14, the disposing of the plurality of first electrodes 131 (S20) and the disposing of the plurality of electrode protection layers EPL (S30) may be simultaneously performed by patterning conductive films stacked on the via-layer 12.

The electrode protection layer EPL is provided to protect the first electrode 131 in a patterning process of the pixel-defining layer 132, and may be made of a material of which an etching ratio by an etching material for the pixel-defining layer 132 is higher than that of the first electrode 131.

The electrode protection layer EPL may be made of a material of which an etching ratio by the etching material for the pixel-defining layer 132 is slightly higher than that of the pixel-defining layer 132, in order to be easily removed.

As an example, the electrode protection layer EPL may be made of at least one of In—Zn—O (IZO) and In—Ga—Zn—O (IGZO).

After the plurality of first electrodes 131 corresponding to the plurality of pixel areas PX and the plurality of electrode protection layers EPL, respectively, are disposed, the pixel-defining layer 132 covering the plurality of first electrodes 131 and the plurality of electrode protection layers EPL is disposed on the via-layer 12 (S40).

The disposing of the pixel-defining layer 132 (S40) may include applying an inorganic insulating material onto the via-layer 12.

Examples of the inorganic insulating material may include silicon nitride, aluminum nitride, zirconium nitride, titanium nitride, hafnium nitride, tantalum nitride, silicon oxide, aluminum oxide, titanium oxide, tin oxide, silicon oxynitride, and the like.

Next, the plurality of first opening parts OP1 and the plurality of second opening parts OP2 are disposed (S50).

The disposing of the plurality of first opening parts OP1 and the plurality of second opening parts OP2 (S50) may include preparing the plurality of first opening parts OP1 and the plurality of second opening parts OP2 by patterning the pixel-defining layer 132 in a state in which a predetermined patterning mask is disposed on the pixel-defining layer 132, and preparing the electrode undercuts EUC corresponding to the edges of the first opening parts OP1 and formed as gaps between the first electrodes 131 and the pixel-defining layer 132 by patterning the electrode protection layers EPL.

Figure 16:
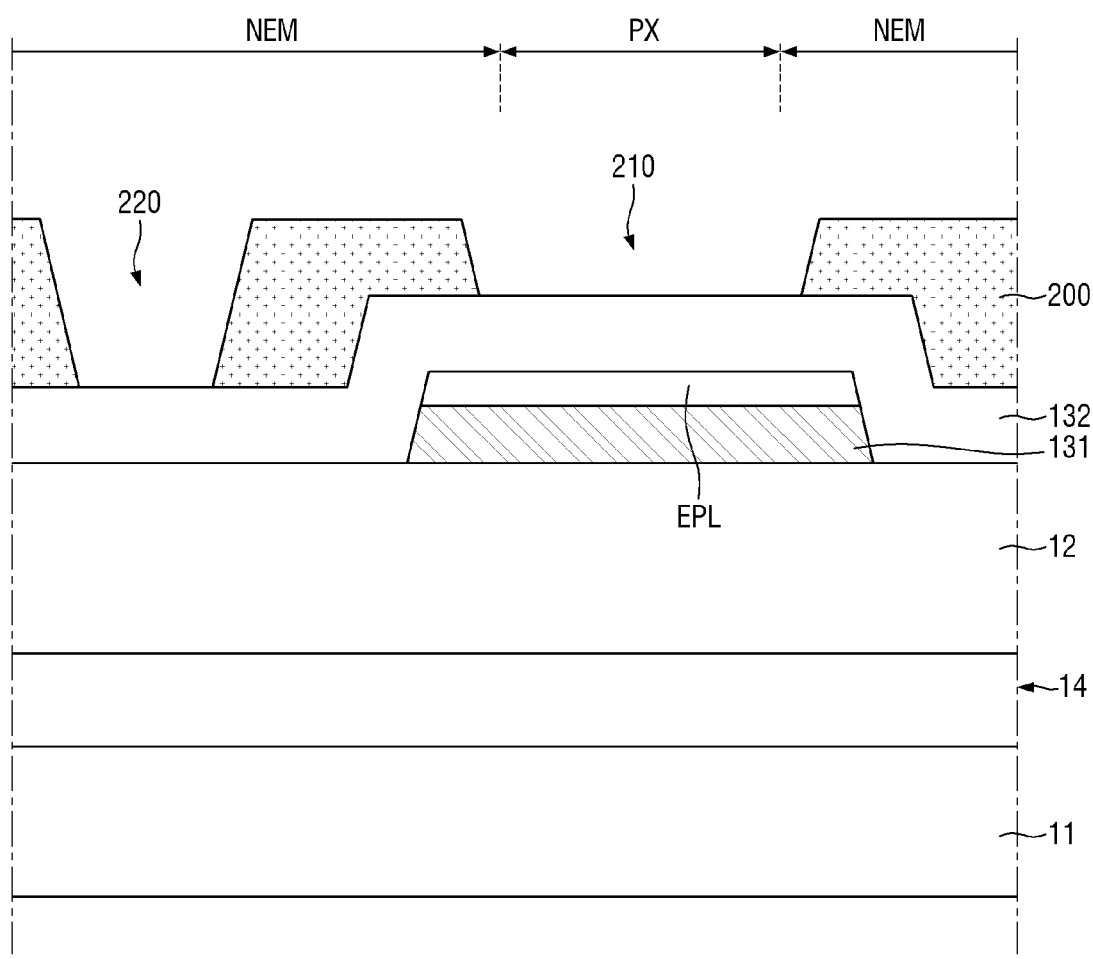

Referring to FIG. 16, a predetermined patterning mask 200 is disposed on the pixel-defining layer 132 covering the first electrodes 131 and the electrode protection layers EPL.

The patterning mask 200 may define first patterning holes 210 therein, corresponding to central portions of the first electrodes 131, respectively, and a plurality of second patterning holes 220 corresponding to the peripheries of the first electrodes 131, respectively.

The second patterning holes 220 are disposed in the non-emitting areas NEM between pixel areas PX1 and PX2, between the pixel areas PX2 and PX3, and between the pixel areas PX1 and PX3 corresponding to different colors and neighboring to each other.

In addition, when the display panel 10A according to another embodiment illustrated in FIGS. 10 and 11 is fabricated, the patterning mask 200 may include two or more second patterning holes 220 disposed in parallel with each other in the non-emitting areas NEM between the pixel areas corresponding to the different colors and neighboring to each other (e.g., between PX1 and PX2, between PX2 and PX3, and between PX1 and PX3).

The patterning mask 200 may be made of a photoresist material.

Figure 17:
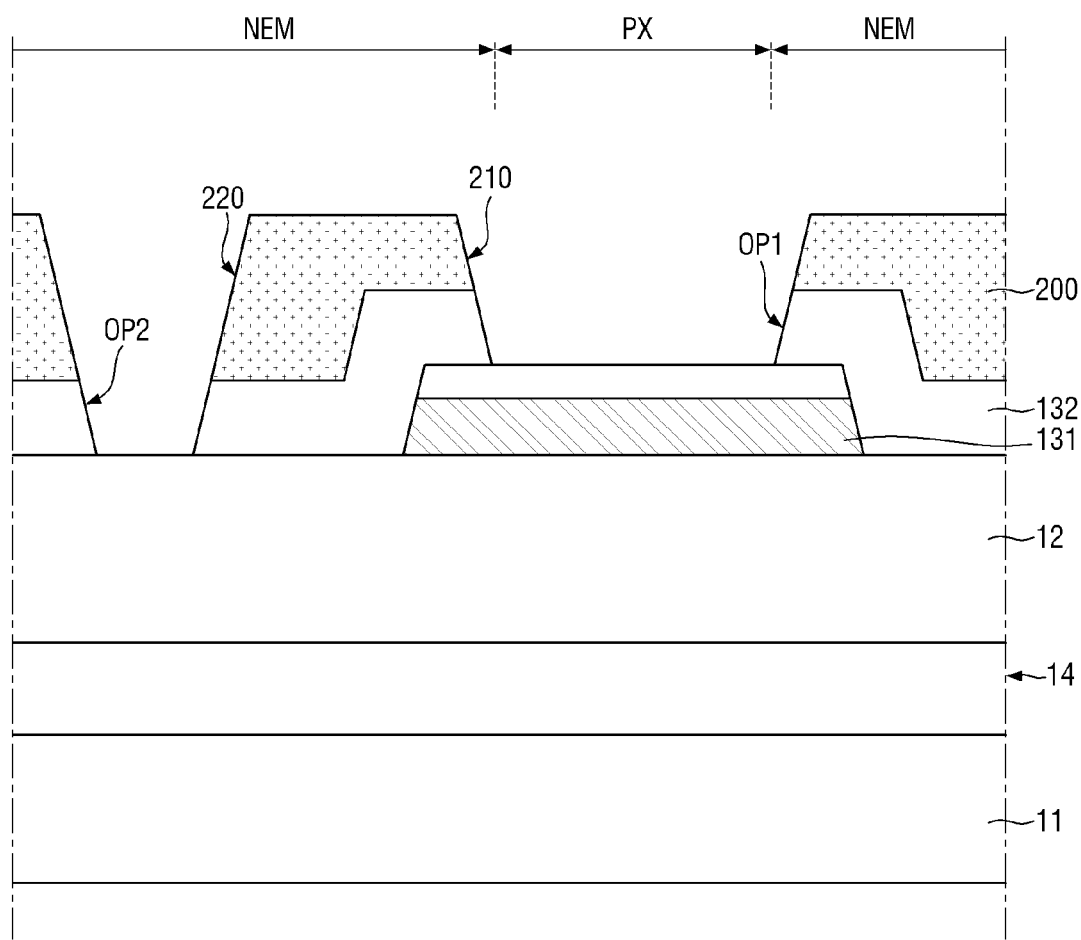

Referring to FIG. 17, the first opening parts OP1 and the plurality of second opening parts OP2 may be prepared by patterning the pixel-defining layer 132 using the patterning mask 200.

In this case, the pixel-defining layer 132 exposed through the first patterning holes 210 of the patterning mask 200 is removed, such that the first opening parts OP1 may be prepared.

In addition, the pixel-defining layer 132 exposed through the second patterning holes 220 of the patterning mask 200 is removed, such that the second opening parts OP2 may be prepared.

Figure 18:
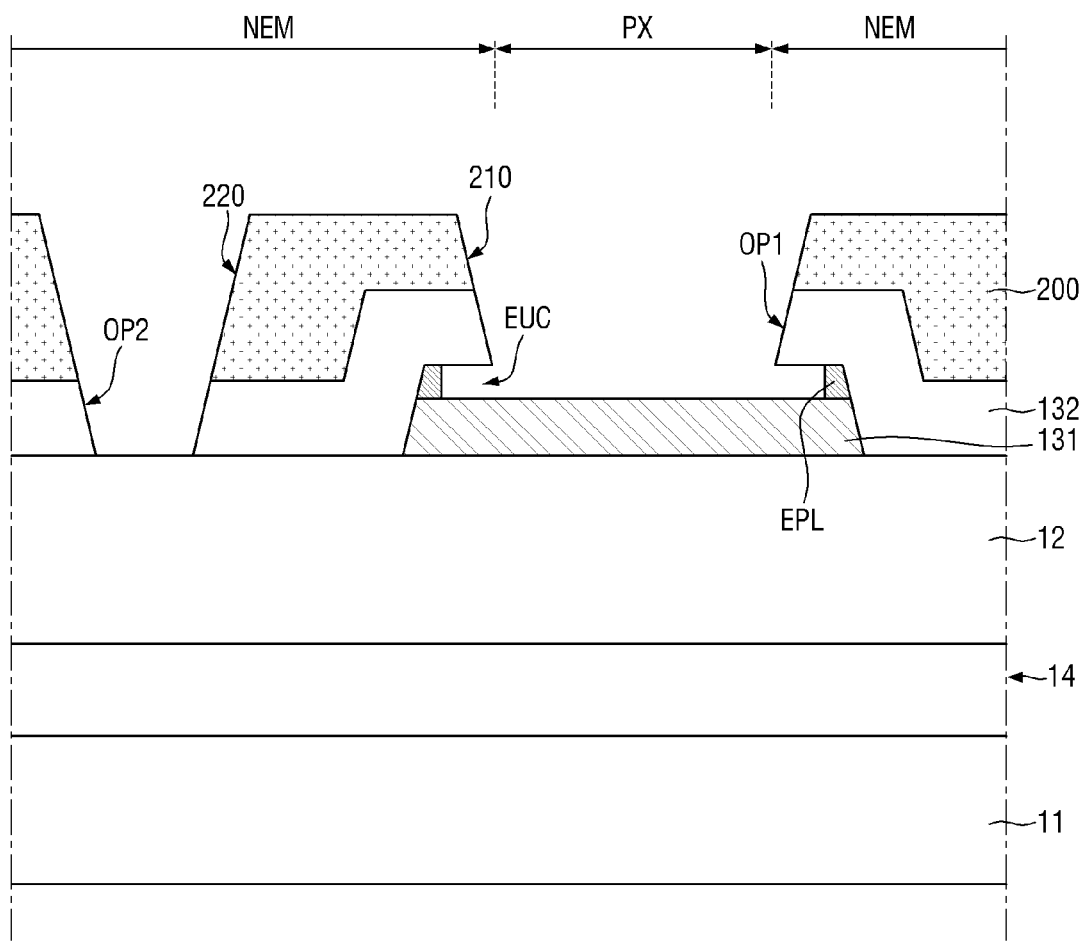

Referring to FIG. 18, even after the first opening parts OP1 and the second opening parts OP2 are disposed, a patterning process using the patterning mask 200 is continuously maintained. In this case, since the pixel-defining layer 132 is made of an inorganic insulating material, the electrode protection layer EPL also react to an etching material for patterning the pixel-defining layer 132. Accordingly, portions of the electrode protection layers EPL corresponding to the first opening parts OP1 are removed, such that the electrode undercuts EUC are prepared.

That is, since the electrode protection layers EPL are made of a material having an etching rate higher than an etching rate of the pixel-defining layer 132, the electrode protection layers EPL are removed around the first opening part OP1, while the pixel-defining layer 132 is maintained, such that the electrode undercuts EUC in which the first electrodes 131 and the pixel-defining layer 132 are spaced apart from each other while directly facing each other may be prepared.

Figure 19:
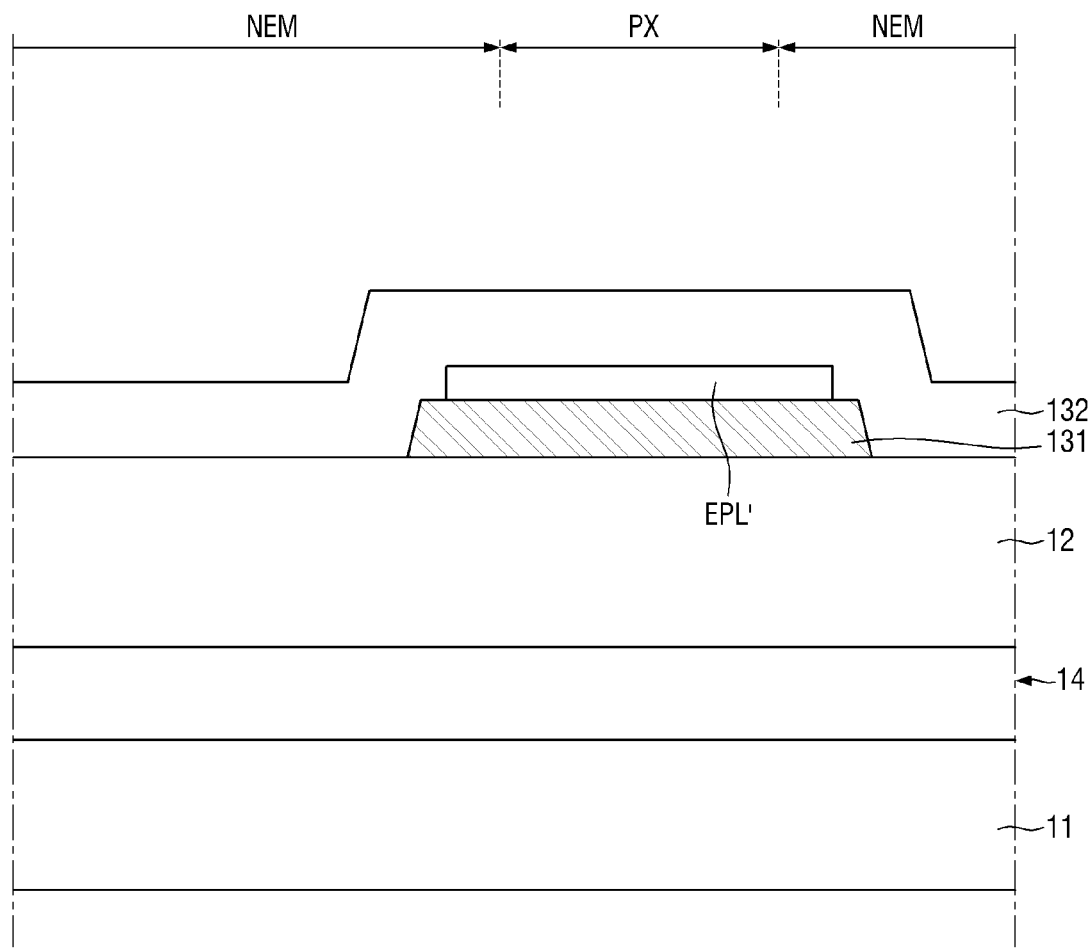

Meanwhile, referring to FIG. 19, in the disposing of the electrode protection layers EPL' (S30), the electrode protection layers EPL' may be prepared by a patterning process separate from the first electrodes 131, and may be formed to have a width smaller than the first electrodes 131 and corresponding to each of the first opening parts OP1 and the electrode undercuts EUC.

Figure 20:
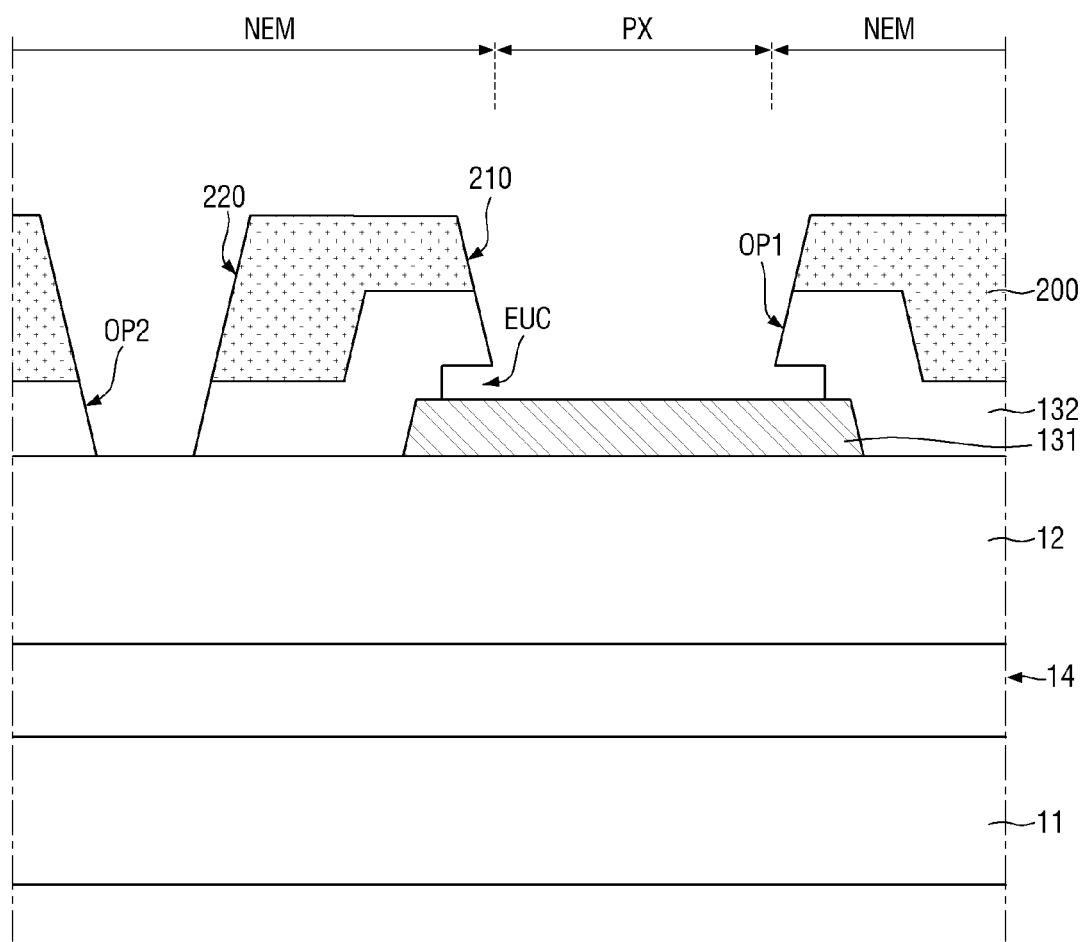

In addition, referring to FIG. 20, in the disposing of the electrode undercuts EUC, the electrode protection layers EPL' (see FIG. 19) may be completely removed.

Alternatively, as illustrated in FIG. 18, when the electrode protection layers EPL are formed to have a width corresponding to the first electrodes 131, if the patterning process is finished after the electrode undercuts EUC are prepared, electrode protection layers EPL may remain at the edges of the first electrodes 131. This is to minimize a time during which the surfaces of the first electrodes 131 are exposed to the patterning process.

Figure 21:
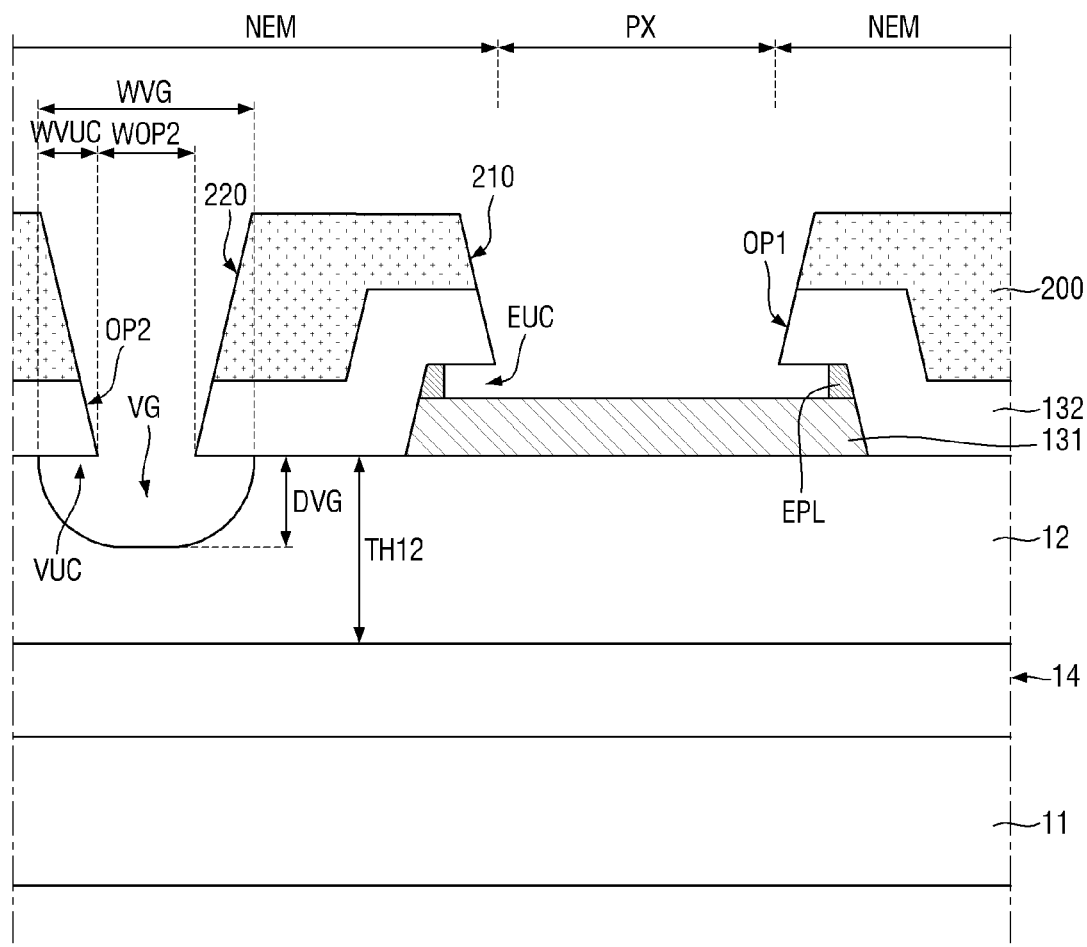

Referring to FIG. 21, the plurality of via-grooves VG are disposed by patterning portions of the via-layer 12 corresponding to the second opening parts OP2 (S60).

The via-groove VG is formed to penetrate through at least a portion of the via-layer 12. That is, a depth DVG of the via-groove VG may be less than a thickness TH12 of the via-layer 12.

The width WVG of the via-groove VG exceeds a width WOP2 of the second opening part OP2. Therefore, a lower surface of the pixel-defining layer 132 corresponding to the periphery of the second opening part OP2 protrudes from an upper surface of the via-layer 12 corresponding to the periphery of the via-groove VG, such that the via-undercut VUC may be prepared.

In this case, a width WVUC of the via-undercut VUC may be about 0.35 µm or more. In this case, reliability for partial separation of the emitting structure 133 and the second electrode 134 disposed on the pixel-defining layer 132, by the via-undercut VUC may be effectively improved.

In addition, a ratio of the width WVUC of the via-undercut VUC to a height of the via-undercut VUC (i.e., the depth DVG of the via-groove VG) may be in the range of about 50% to about 100%. In this case, it is possible to prevent the via-groove VG from extending below the via-layer 12.

To this end, the disposing of the plurality of via-grooves VG (S60) may include performing isotropic dry etching on the via-layer 12.

In addition, in order to secure the width WVUC of the via-undercut VUC of about 0.35 µm or more, the height of the via-undercut VUC (i.e., the depth DVG of the via-groove VG) may be about 0.7 µm or more.

After the disposing of the plurality of via-grooves VG (S60), the patterning mask 200 on the pixel-defining layer 132 may be removed.

In addition, the emitting structure 133 is disposed on the plurality of first electrodes 131 and the pixel-defining layer 132 (S70). The disposing of the emitting structure 133 may include disposing a hole transport layer 1332, disposing an emitting layer 1331, and disposing an electron transport layer 1333.

Figure 22:
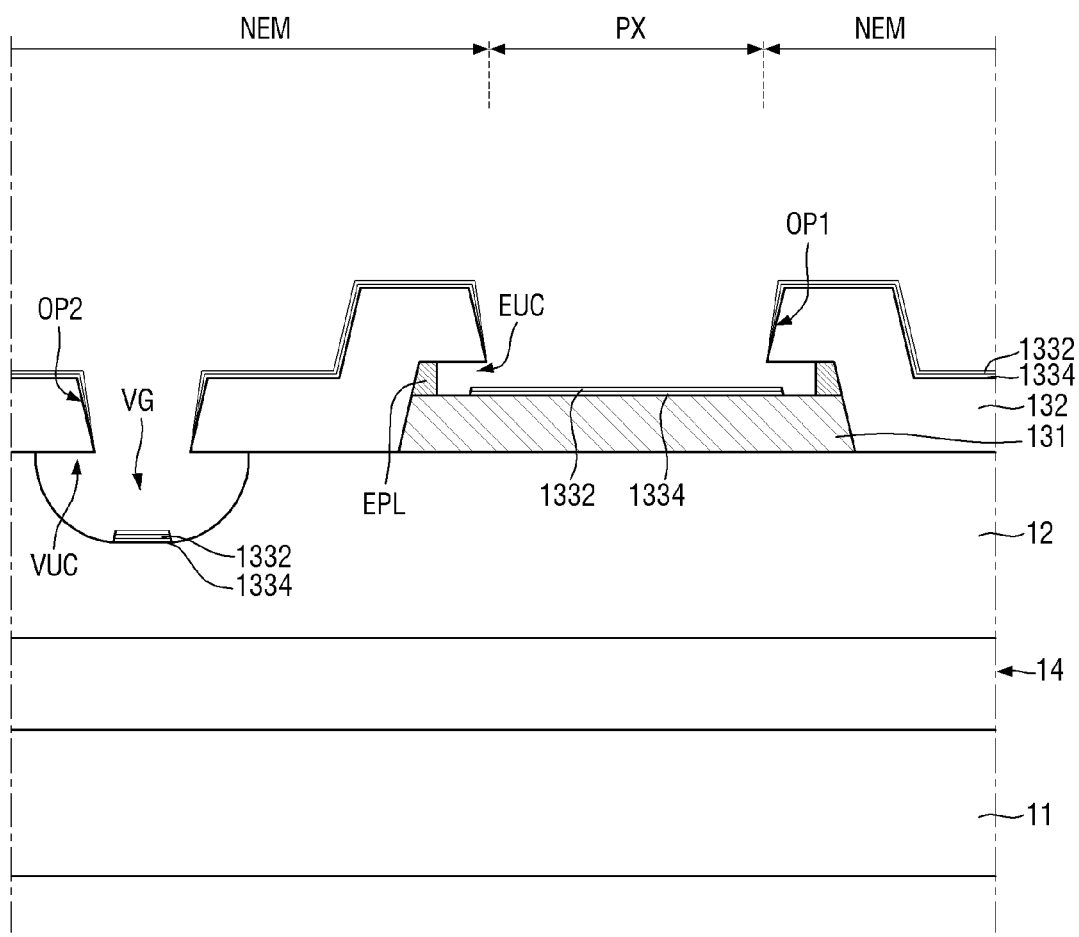

Referring to FIG. 22, the hole transport layer 1332 entirely corresponding to the plurality of pixel areas PX may be disposed by depositing a hole transporting material on the first electrode 131 and the pixel-defining layer 132.

In this case, a hole injection layer 1334 may be disposed before the hole transport layer 1332 is disposed.

Figure 23:
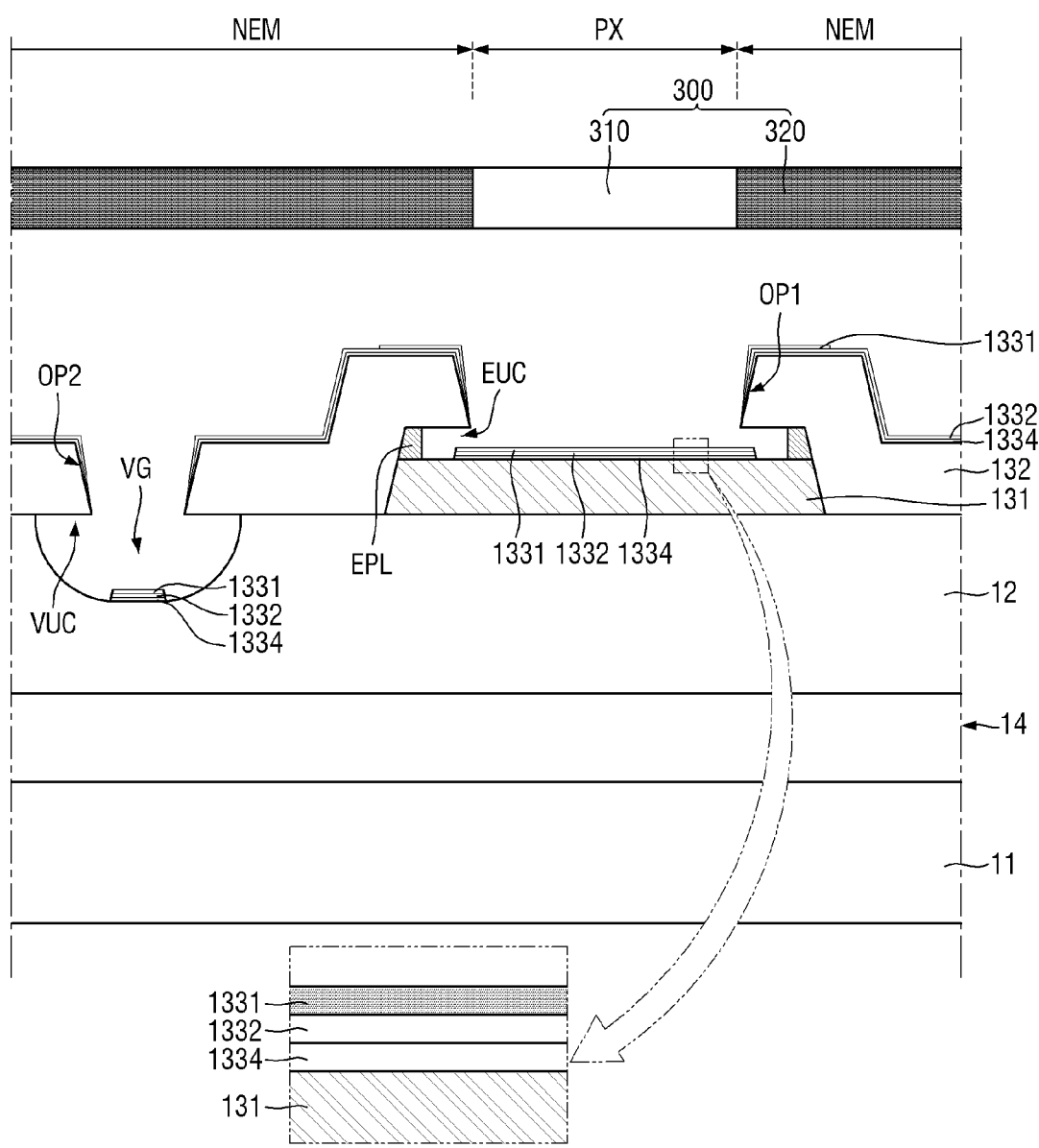

Referring to FIG. 23, the emitting layer 1331 corresponding to each of the plurality of pixel areas PX may be disposed on the hole transport layer 1332 using a predetermined deposition mask 300.

The deposition mask 300 may include a transmission part 310 corresponding to each of at least portions of the plurality of pixel areas PX, and a blocking part 320 corresponding to each of the other portions of the plurality of pixel areas PX and the non-emitting areas NEM.

The deposition mask 300 may be prepared for each color of colors corresponding to the plurality of pixel areas PX.

As an example, the disposing of the emitting layer 1331 may include disposing an emitting layer of a first color using a deposition mask of the first color corresponding to pixel areas displaying the first color among the plurality of pixel areas PX, disposing an emitting layer of a second color using a deposition mask of the second color corresponding to pixel areas displaying the second color among the plurality of pixel areas PX, and disposing an emitting layer of a third color using a deposition mask of the third color corresponding to pixel areas displaying the third color among the plurality of pixel areas PX.

Alternatively, when the plurality of pixel areas PX display a single color, the emitting layer 1331 may be disposed using the deposition mask 300 including the transmission part 310 corresponding to each of the plurality of pixel areas PX and the blocking part 320 corresponding to the non-emitting area NEM.

The transmission part 310 of the deposition mask 300 may be formed to have a greater width than the first opening part OP1. Accordingly, the emitting layer 1331 may be not only disposed on the first electrode 131 of each pixel area PX exposed through the first opening part OP1, but may be also disposed on the pixel-defining layer 132 around each pixel area PX.

Figure 24:
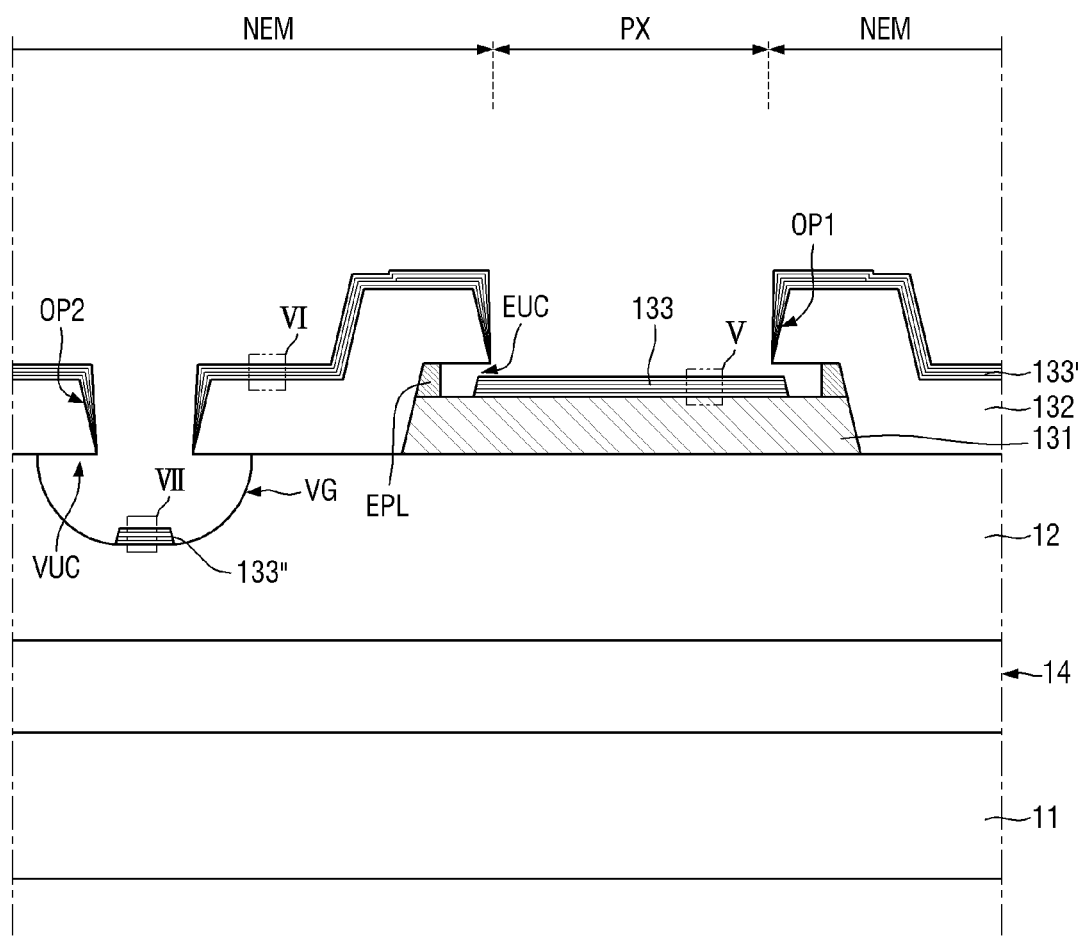
Figure 26:
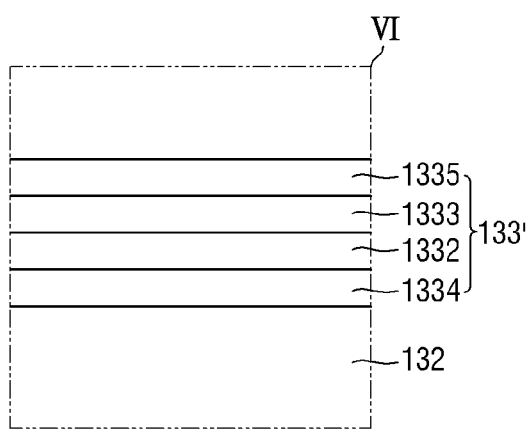

Referring to FIGS. 24, to 26, the electron transport layer 1333 entirely corresponding to the plurality of pixel areas PX may be disposed by depositing an electron transporting material on the emitting layer 1331 and the hole transport layer 1332.

In this case, an electron injection layer 1335 may be further disposed after the electron transport layer 1333 is disposed.

Figure 25:
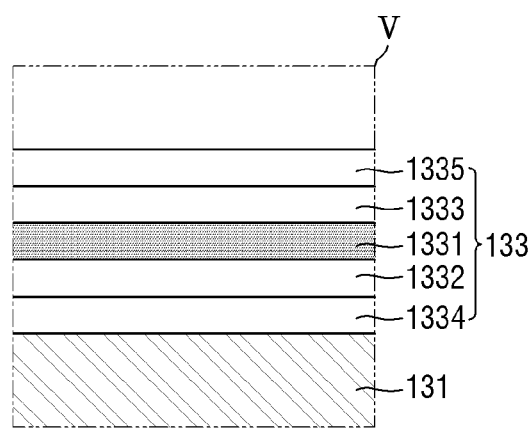

Therefore, as illustrated in FIG. 25, the emitting structure 133 including the hole transport layer 1332, the emitting layer 1331, and the electron transport layer 1333 is disposed on the first electrode 131. Here, the emitting structure 133 may further include the hole injection layer 1334 disposed between the first electrode 131 and the hole transport layer 1332 or the electron injection layer 1335 disposed between the second electrode 134 and the electron transport layer 1333.

In addition, as illustrated in FIG. 26, a portion of an emitting structure 133' disposed in the non-emitting area NEM around each pixel area PX has the same structure as the emitting structure 133 on the first electrode 131, and the other portion of the emitting structure 133' does not include the emitting layer 1331 unlike the emitting structure 133 on the first electrode 131.

Second opening parts OP2 and via-grooves VG are formed in portions of the non-emitting areas NEM between the pixel areas for emitting light of different colors and neighboring to each other (e.g., between PX1 and PX2, between PX1 and PX3, and between PX2 and PX3), and an emitting structure 133" is also disposed in the via-grooves VG through the second opening parts OP2.

Figure 27:
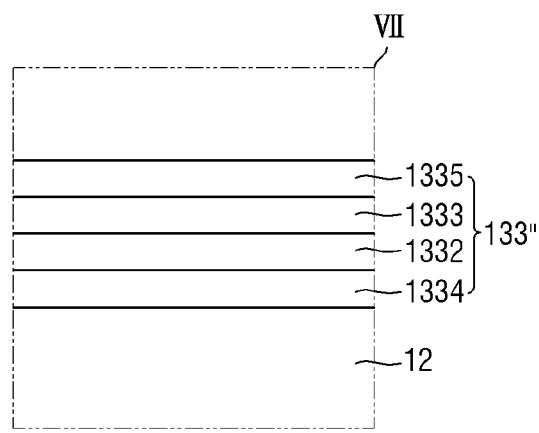

As illustrated in FIG. 27, the emitting structure 133" disposed in the via-groove VG of the non-emitting area NEM does not include the emitting layer 1331 unlike the emitting structure 133 on the first electrode 131.

As illustrated in FIG. 24, the emitting structure 133 on the first electrode 131 may be separated from the emitting structure 133' on the pixel-defining layer 132 by the electrode undercut EUC to be formed in an independent island-shaped pattern.

In addition, in the non-emitting areas NEM between the pixel areas PX1 and PX2, between the pixel areas PX2 and PX3, and between the pixel areas PX1 and PX3 corresponding to the different colors and neighboring to each other, the emitting structure 133' on the pixel-defining layer 132 is separated from the emitting structure 133" of the via-groove VG by the via-undercut VUC. Therefore, the emitting structures 133' and 133" disposed in the non-emitting areas NEM between the pixel areas PX1 and PX2, between the pixel areas PX2 and PX3, and between the pixel areas PX1 and PX3 corresponding to the different colors and neighboring to each other each are partially separated from each other.

Accordingly, a leakage current due to a common layer entirely corresponding to the plurality of pixel areas PX such as the hole transport layer 1332 or the like of the emitting structure 133 may be prevented. Therefore, a defect that light is emitted due to a driving current of a neighboring pixel area may be prevented to prevent deterioration of a display quality of the display panel 10.

Figure 28:
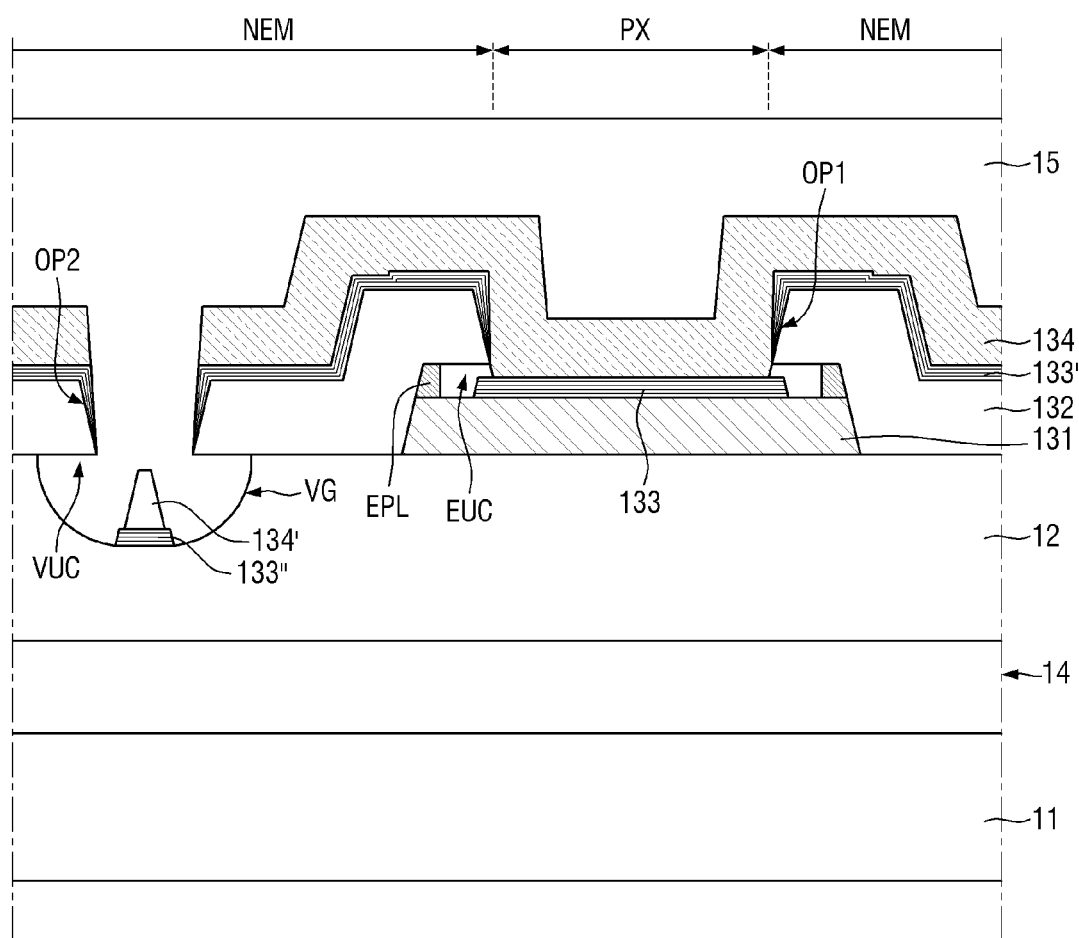

Referring to FIG. 28, the second electrode corresponding to the plurality of pixel areas PX is disposed on the emitting structures 133, 133', and 133" (S80). The second electrode 134' disposed on the emitting structure 133" is completely separated from the second electrode 134 disposed on the emitting structure 133 and 133'.

The second electrode 134 may include a transparent metal oxide material such as ITO, IZO, and IGZO.

After the disposing of the second electrode 134 (S80), the encapsulation structure 15 may be disposed on the second electrode 134.

The encapsulation structure 15 seals the emitting device layer 13 to prevent oxygen or moisture from penetrating into the emitting structure 133, and may have a structure in which insulating layers having different materials or different thicknesses are stacked.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display panel comprising:
   a substrate including a plurality of pixel areas;
   a via-layer disposed on the substrate;
   a plurality of first electrodes disposed on the via-layer and corresponding to the plurality of pixel areas, respectively;
   a pixel-defining layer disposed on the via-layer and made of an inorganic insulating material;
   first opening parts corresponding to central portions of the first electrodes and penetrating through the pixel-defining layer;
   electrode undercuts corresponding to edges of the first opening parts and provided as gaps between the first electrodes and the pixel-defining layer;
   a plurality of second opening parts corresponding to peripheries of the first electrodes, respectively, spaced apart from each other, and penetrating through the pixel-defining layer;
   via-grooves corresponding to the second opening parts and defined on an upper surface of the via-layer;
   via-undercuts provided by the pixel-defining layer around the second opening parts and the via-layer around the via-grooves;
   an emitting structure disposed on the first electrodes and the pixel-defining layer; and
   a second electrode corresponding to the plurality of pixel areas and disposed on the emitting structure,
   wherein the emitting structure disposed on the first electrodes includes an emitting layer, a hole transport layer disposed between the emitting layer and the first electrodes, and an electron transport layer disposed between the emitting layer and the second electrode,
   the emitting structure disposed on the pixel defining layer includes the hole transport layer and the electron transport layer, and
   the hole transport layer and the electron transport layer of the emitting structure disposed on the pixel defining layer and the second electrode each are partially separated by a corresponding via-undercut.

2. The display panel of claim 1, wherein the second opening parts are disposed in non-emitting areas between pixel areas corresponding to different colors and neighboring to each other among the plurality of pixel areas, and are formed in parallel with each other at edges of the first electrodes.

3. The display panel of claim 2, wherein each of the via-grooves has a greater width than each of the second opening parts, and
   each of the via-undercut is provided by a structure in which a lower surface of the pixel-defining layer around a corresponding second opening part protrudes from the upper surface of the via-layer around a corresponding via-groove.

4. The display panel of claim 3, wherein
   the emitting layer corresponds to each of the plurality of pixel areas, and
   the hole transport layer and the electron transport layer correspond to the plurality of pixel areas.

5. The display panel of claim 4, wherein the hole transport layer, the electron transport layer, and the second electrode are further disposed in the via-groove, and
   the hole transport layer of the via-groove is separated from the hole transport layer on the pixel-defining layer by the via-undercut.

6. The display panel of claim 4, wherein the via-undercut has a width of about 0.35 micrometers (μm) or more.

7. The display panel of claim 6, wherein a ratio of a width of the via-undercut to a height of the via-undercut is in a range of about 50 percentages (%) to about 100%.

8. The display panel of claim 6, wherein two or more second opening parts are disposed in parallel with each other in the non-emitting areas between two pixel areas corresponding to the different colors and neighboring to each other among the plurality of pixel areas, and
   a gap of any two of the two or more second opening parts is about 1 μm or more.

9. The display panel of claim 4, further comprising:
   a circuit layer disposed on the substrate, including a plurality of thin film transistors corresponding to the plurality of pixel areas, and covered with the via-layer; and
   groove protection layers disposed between the circuit layer and the via-layer,
   wherein the groove protection layers are disposed in the non-emitting areas between the pixel areas corresponding to the different colors and neighboring to each other among the plurality of pixel areas, and
   at least portions of the groove protection layers are exposed to the via-grooves.

10. The display panel of claim 9, further comprising an auxiliary via-layer disposed between the circuit layer and the via-layer,
    wherein the groove protection layers are disposed on the auxiliary via-layer.

11. The display panel of claim 10, wherein the electrode protection layer is made of any one of IZO and IGZO.

12. The display panel of claim 4, wherein each of the central portions of the first electrodes corresponding to each of the first opening parts refers to a remaining portion of a corresponding first electrode excluding an edge of the first electrode, the edge of the first electrode is covered with the pixel-defining layer, in the electrode undercut, the first electrode and the pixel-defining layer are spaced apart from each other while directly facing each other, and the emitting structure on the first electrode is separated from the emitting structure on the pixel-defining layer by the electrode undercut.

13. The display panel of claim 12, further comprising an electrode protection layer corresponding to an edge of the electrode undercut, disposed on the edge of the first electrode, and covered with the pixel-defining layer, wherein the electrode undercut is provided by a structure in which the lower surface of the pixel-defining layer corresponding to the edge of the first opening part protrudes from the electrode protection layer.

\* \* \* \* \*